United States Patent
Wade et al.

(10) Patent No.: US 12,288,249 B2
(45) Date of Patent: Apr. 29, 2025

(54) SYSTEMS AND METHODS FOR GENERATING THREE-DIMENSIONAL MODELS CORRESPONDING TO PRODUCT BUNDLES

(71) Applicant: SHOPIFY INC., Ottawa (CA)

(72) Inventors: Jonathan Wade, Ottawa (CA); Byron Leonel Delgado, Ottawa (CA); Daniel Beauchamp, Toronto (CA)

(73) Assignee: SHOPIFY INC., Ottawa (CA)

( * ) Notice: Subject to any disclaimer, the term of this patent is extended or adjusted under 35 U.S.C. 154(b) by 666 days.

(21) Appl. No.: 17/334,930

(22) Filed: May 31, 2021

(65) Prior Publication Data

US 2022/0383400 A1      Dec. 1, 2022

(51) Int. Cl.
   *G06Q 30/0601* (2023.01)
   *G06F 30/10* (2020.01)
   *G06T 19/20* (2011.01)

(52) U.S. Cl.
   CPC ......... *G06Q 30/0643* (2013.01); *G06F 30/10* (2020.01); *G06Q 30/0623* (2013.01); *G06Q 30/0631* (2013.01); *G06Q 30/0633* (2013.01); *G06T 19/20* (2013.01); *G06T 2219/2004* (2013.01)

(58) Field of Classification Search
   CPC ...... G06Q 30/0601–0643; G06T 1/007; G06T 19/006; G06T 19/20; G06T 2211/428; G06T 2211/441; G06T 2215/00–16; G06T 2219/00; G06T 2219/20–2024; G06F 30/13
   See application file for complete search history.

(56) References Cited

U.S. PATENT DOCUMENTS

| | | |
|---|---|---|
| 4,972,494 A | 11/1990 | White et al. |
| 6,373,519 B1 | 4/2002 | Sybert et al. |
| 9,619,835 B1 * | 4/2017 | Sarda ................ G06Q 30/0641 |
| 10,467,507 B1 | 11/2019 | Hao et al. |
| 11,042,953 B1 | 6/2021 | Delgado et al. |
| 2002/0102018 A1 | 8/2002 | Lin et al. |
| 2005/0081161 A1 * | 4/2005 | MacInnes ............. G06Q 30/01 715/848 |

(Continued)

OTHER PUBLICATIONS

Malhotra, A. (2018). 6 cutting-edge technologies that will change use way we shop. Twice, 33(3), 23. Retrieved from https://dialog.proquest.com/professional/docview/2011220981?accountid=131444 (Year: 2018).*

(Continued)

*Primary Examiner* — William J Allen

(57) ABSTRACT

Generating and storing product media can be resource intensive processes. Some systems and methods disclosed herein relate to rapidly and/or automatically generating a three-dimensional (3D) composite model to help improve the generation of product media and/or to help reduce product media storage requirements. The 3D composite model may correspond to a product bundle. According to an embodiment, an indication of items associated with a product bundle is obtained. Pre-existing 3D models corresponding to the items are then obtained and used to generate a 3D composite model. The 3D composite model includes representations of the items and may be implemented to provide product media depicting the product bundle.

25 Claims, 11 Drawing Sheets

(56) References Cited

U.S. PATENT DOCUMENTS

| | | | | |
|---|---|---|---|---|
| 2009/0132943 | A1* | 5/2009 | Minsky | G06Q 30/0643 |
| | | | | 715/767 |
| 2010/0325016 | A1* | 12/2010 | Marcus | G06Q 30/0643 |
| | | | | 707/769 |
| 2011/0075937 | A1 | 3/2011 | Tate | |
| 2013/0036024 | A1* | 2/2013 | Boettcher | G06Q 30/06 |
| | | | | 705/26.8 |
| 2013/0238288 | A1* | 9/2013 | Rolleston | G06T 19/00 |
| | | | | 703/1 |
| 2015/0186976 | A1* | 7/2015 | Ohkubo | A63F 13/69 |
| | | | | 705/26.7 |
| 2015/0363872 | A1* | 12/2015 | Weinhold | G06F 3/04842 |
| | | | | 705/14.23 |
| 2016/0343054 | A1 | 11/2016 | Chu et al. | |
| 2017/0278173 | A1* | 9/2017 | Ettl | G06Q 30/0631 |
| 2018/0025487 | A1 | 1/2018 | Macdonald | |
| 2019/0251753 | A1* | 8/2019 | Canada | G06T 11/60 |
| 2019/0295246 | A1 | 9/2019 | Smith et al. | |
| 2019/0325501 | A1* | 10/2019 | Jensen | G06F 3/0482 |
| 2019/0340829 | A1* | 11/2019 | Marshall | G06T 19/20 |
| 2019/0347783 | A1 | 11/2019 | Salgian et al. | |
| 2019/0362480 | A1 | 11/2019 | Diao et al. | |
| 2021/0192660 | A1 | 6/2021 | Delgado et al. | |
| 2021/0256648 | A1 | 8/2021 | Delgado et al. | |
| 2022/0122144 | A1* | 4/2022 | Papale, III | G06Q 30/0621 |

OTHER PUBLICATIONS 3D visualisation to touch; RTT in partnership with microsoft deutschland. (May 5, 2009). M2 Presswire Retrieved from https://dialog.proquest.com/professional/docview/1077624546?accountid=131444 (Year: 2009).*

Notice of Allowance issued on U.S. Appl. No. 17/307,016, dated May 24, 2022. 8 pages.

Non-Final Office Action issued on U.S. Appl. No. 17/307,016, dated Apr. 12, 2022. 13 pages.

Non-Final Office Action issued on U.S. Appl. No. 16/724,658, dated Jan. 26, 2021. 14 pages.

* cited by examiner

FIG. 2

SYSTEMS AND METHODS FOR GENERATING THREE-DIMENSIONAL MODELS CORRESPONDING TO PRODUCT BUNDLES

FIELD

The present application relates to digital media and, in particular embodiments, to systems and methods for generating three-dimensional (3D) models.

BACKGROUND

E-commerce has become an increasingly popular means for merchants to drive sales of their products. These products may be presented to customers via product media, which may also be referred to as "product assets". Product media may include any form of digital media, including images, videos and/or three-dimensional (3D) models, for example, that depict a product. In some cases, product media may be implemented in an online store and/or in another form of online merchandising to allow a customer to view a product. However, obtaining product media may be resource intensive for a merchant. For example, product media may be expensive and/or time-consuming to generate. Creating high-quality product images and videos may involve the use of a professional photographer, a professional videographer and/or photography studio time. The cost and time associated with generating product media may be compounded when a merchant's product offerings are flexible and/or rapidly changing.

SUMMARY

Some embodiments of the present disclosure provide systems and methods for rapidly and/or automatically generating 3D composite models corresponding to product bundles. A product bundle is a group or set of products or items that are sold together as a single unit. In the field of e-commerce, product bundles may be flexible (e.g., a customer may choose the products included in a product bundle) and/or may be rapidly changing (e.g., a computing system may automatically generate and/or update product bundles based on customer behaviour). In this way, product bundles are an example of a product offering where it may be expensive and/or time consuming to obtain product media for using conventional methods. For example, using a photographer and/or a graphical designer to generate product media for each product bundle sold by a merchant may be excessively resource intensive. Additionally, storing product media depicting each possible variation of a product bundle sold by a merchant may result in the excessive use of computer storage resources.

In some embodiments, product media for a product bundle is generated using pre-existing 3D models of the individual products and/or groups of products in the product bundle. These 3D models may be combined into a single 3D composite model that provides a representation of each of the products. For example, the 3D composite model may be generated by placing the pre-existing 3D models in a single virtual environment or scene. In some cases, the 3D composite model may be generated automatically by a computing system in response to the product bundle being created or suggested. Once generated, the 3D composite model may be provided on a product page of an online store and/or may be rendered to produce two-dimensional (2D) content depicting the product bundle. In this way, the 3D composite model may leverage pre-existing 3D models to more efficiently produce product media for the product bundle. The 3D composite model may provide a single instance of product media that depicts the entire product bundle, which could conserve network resources in some cases. For example, one instance of product media might be transmitted to a user device to depict the product bundle, rather than multiple instances of product media that each depict a single product in the bundle.

According to an aspect of the present disclosure, there is provided a computer-implemented method that includes obtaining an indication of items associated with a product bundle, obtaining 3D models corresponding to the items, and generating a 3D composite model. The 3D composite model may include representations of the items that are based on the 3D models corresponding to the items.

In some embodiments, generating the 3D composite model includes obtaining a 3D model template associated with at least one of the items, and generating the 3D composite model based on the 3D model template. The at least one of the items may be sold online by a software instance, and obtaining the 3D model template associated with the at least one of the items may include obtaining the 3D model template based on the software instance. The 3D model template may include background content, in which case generating the 3D composite model based on the 3D model template may include combining the 3D models corresponding to the items with the background content in the 3D composite model. Optionally, the background content includes virtual lighting. The 3D model template may also or instead include a defined item arrangement, in which case generating the 3D composite model based on the 3D model template may include placing the 3D models corresponding to the items relative to each other in the 3D composite model based on the defined item arrangement.

In some embodiments, the product bundle is at least partially user selected. Obtaining the indication of the items may include receiving, from a user device, a first indication selecting at least one of the items. Generating the 3D composite model may then be based on the first indication selecting at least one of the items. Optionally, the generating the 3D composite model is performed responsive to receiving the first indication selecting at least one of the items. In some embodiments, the method further includes receiving, from the user device, a second indication selecting a further item and, responsive to receiving the second indication selecting the further item, updating the 3D composite model to obtain an updated 3D composite model. The updated 3D composite model may include the representations of the items and a representation of the further item.

In some embodiments, the product bundle is at least partially suggested by a system. Obtaining the indication of the items may include obtaining first data regarding customer behavior pertaining to the items and selecting a first item for the product bundle based on the first data. Optionally, the first data may be specific to a particular customer, and the method may further include transmitting, to a user device associated with the particular customer, web content based on the 3D composite model for display on the user device. In some embodiments, selecting the first item for the product bundle is performed responsive to obtaining the first data. Further, obtaining the indication of the items may include obtaining second data regarding customer behavior pertaining to the items and, responsive to obtaining the second data, selecting a second item for the product bundle based on the second data.

In some embodiments, the method includes generating 2D content based on the 3D composite model; receiving, from a user device, a request for web content associated with the product bundle; and transmitting the web content to the user device responsive to the request, the web content including the 2D content.

According to another aspect of the present disclosure, there is provided a system including memory and at least one processor. The memory is to store 3D models corresponding to items. The at least one processor is to obtain an indication that the items are associated with a product bundle and to generate a 3D composite model. The 3D composite model may include representations of the items based on the 3D models corresponding to the items.

In some embodiments, the at least one processor is to obtain a 3D model template associated with at least one of the items and generate the 3D composite model based on the 3D model template. For example, the 3D model template may include background content, and the at least one processor may be to combine the 3D models corresponding to the items with the background content in the 3D composite model. Alternatively or additionally, the 3D model template may include a defined item arrangement, and the at least one processor may be to place the 3D models corresponding to the items relative to each other in the 3D composite model based on the defined item arrangement.

In some embodiments, the at least one processor is to receive, from a user device, a first indication selecting at least one of the items. Optionally, the at least one processor is to generate the 3D composite model responsive to receiving the first indication selecting at least one of the items. The at least one processor may also be to receive, from the user device, a second indication selecting a further item and, responsive to receiving the second indication selecting the further item, update the 3D composite model to obtain an updated 3D composite model. The updated 3D composite model may include the representations of the items and a representation of the further item.

In some embodiments, the items include a first item, and the at least one processor is to obtain first data regarding customer behavior pertaining to the items and select the first item for the product bundle based on the first data. Optionally, the first data is specific to a particular customer, and the at least one processor is to transmit, to a user device associated with the particular customer, web content based on the 3D composite model for display on the user device. In further embodiments, the items further include a second item. The at least one processor may be to select the first item for the product bundle responsive to obtaining the first data; obtain second data regarding customer behavior pertaining to the items; and, responsive to obtaining the second data, select the second item for the product bundle based on the second data.

In some embodiments, the at least one processor is to generate 2D content based on the 3D composite model; receive, from a user device, a request for web content associated with the product bundle; and transmit the web content to the user device responsive to the request, the web content including the 2D content.

According to another aspect of the present disclosure, there is provided a non-transitory computer readable medium storing computer executable instructions. When executed by a computer, the instructions cause the computer to obtain an indication of items associated with a product bundle, obtain 3D models corresponding to the items, and generate a 3D composite model. The 3D composite model may include representations of the items based on the 3D models corresponding to the items.

BRIEF DESCRIPTION OF THE DRAWINGS

Embodiments will be described, by way of example only, with reference to the accompanying figures wherein:

FIG. 2 is an example of a home page of an administrator, according to an embodiment;

DETAILED DESCRIPTION

For illustrative purposes, specific example embodiments will now be explained in greater detail below in conjunction with the figures.

An Example e-Commerce Platform

Although integration with a commerce platform is not required, in some embodiments, the methods disclosed herein may be performed on or in association with a commerce platform such as an e-commerce platform. Therefore, an example of a commerce platform will be described.

Figure 1:
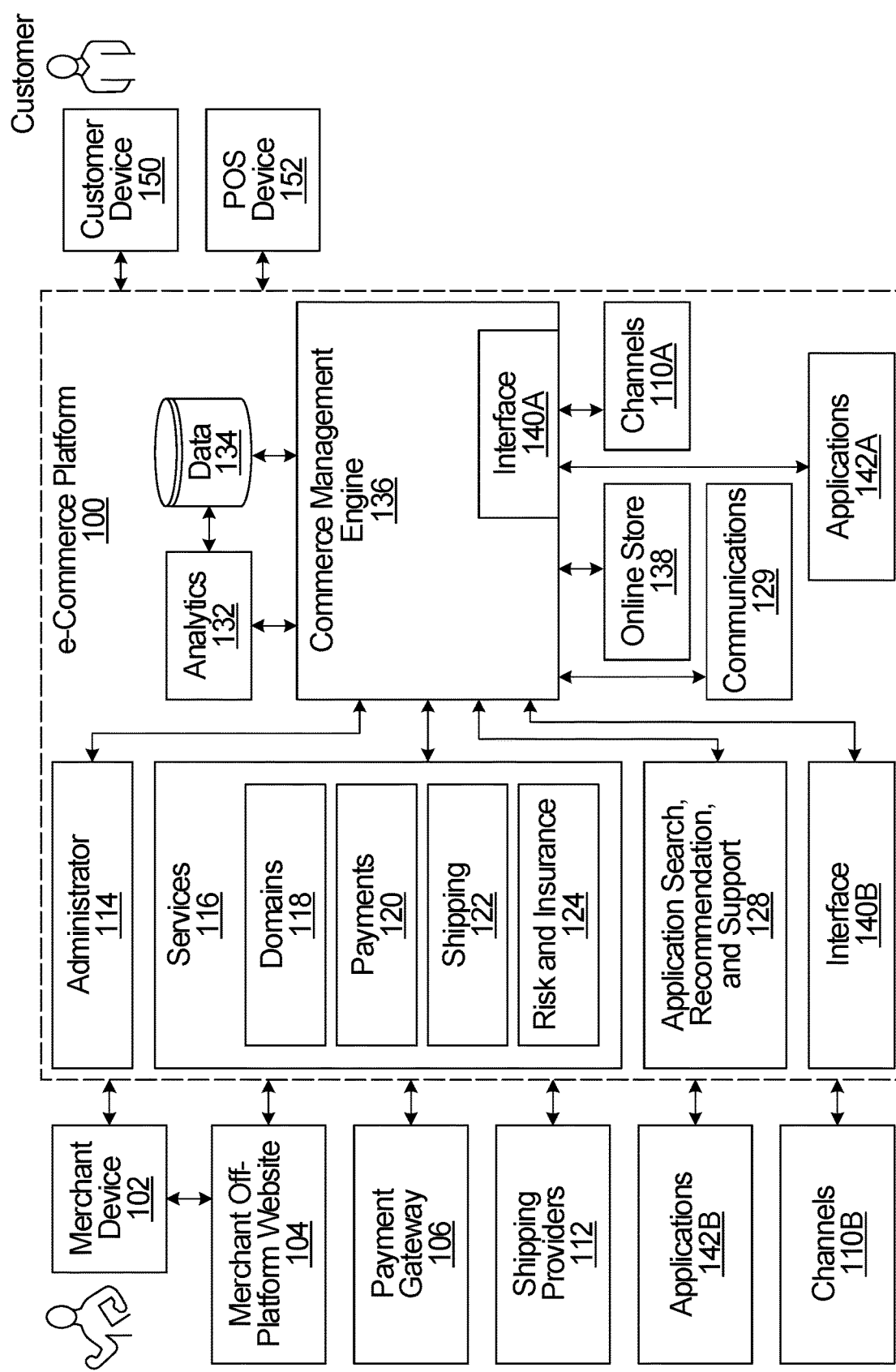
FIG. 1 is a block diagram of an e-commerce platform, according to an embodiment.

FIG. 1 illustrates an example e-commerce platform 100, according to one embodiment. The e-commerce platform 100 may be used to provide merchant products and services to customers. While the disclosure contemplates using the apparatus, system, and process to purchase products and services, for simplicity the description herein will refer to products. All references to products throughout this disclosure should also be understood to be references to products and/or services, including, for example, physical products, digital content (e.g., music, videos, games), software, tickets, subscriptions, services to be provided, and the like.

While the disclosure throughout contemplates that a 'merchant' and a 'customer' may be more than individuals, for simplicity the description herein may generally refer to merchants and customers as such. All references to merchants and customers throughout this disclosure should also be understood to be references to groups of individuals, companies, corporations, computing entities, and the like, and may represent for-profit or not-for-profit exchange of products. Further, while the disclosure throughout refers to 'merchants' and 'customers', and describes their roles as such, the e-commerce platform 100 should be understood to more generally support users in an e-commerce environment, and all references to merchants and customers throughout this disclosure should also be understood to be references to users, such as where a user is a merchant-user (e.g., a seller, retailer, wholesaler, or provider of products), a customer-user (e.g., a buyer, purchase agent, consumer, or user of products), a prospective user (e.g., a user browsing and not yet committed to a purchase, a user evaluating the e-commerce platform 100 for potential use in marketing and selling products, and the like), a service provider user (e.g., a shipping provider 112, a financial provider, and the like), a company or corporate user (e.g., a company representative for purchase, sales, or use of products; an enterprise user; a customer relations or customer management agent, and the like), an information technology user, a computing entity user (e.g., a computing bot for purchase, sales, or use of products), and the like. Furthermore, it may be recognized that while a given user may act in a given role (e.g., as a merchant) and their associated device may be referred to accordingly (e.g., as a merchant device) in one context, that same individual may act in a different role in another context (e.g., as a customer) and that same or another associated device may be referred to accordingly (e.g., as a customer device). For example, an individual may be a merchant for one type of product (e.g., shoes), and a customer/consumer of other types of products (e.g., groceries). In another example, an individual may be both a consumer and a merchant of the same type of product. In a particular example, a merchant that trades in a particular category of goods may act as a customer for that same category of goods when they order from a wholesaler (the wholesaler acting as merchant).

The e-commerce platform 100 provides merchants with online services/facilities to manage their business. The facilities described herein are shown implemented as part of the platform 100 but could also be configured separately from the platform 100, in whole or in part, as stand-alone services. Furthermore, such facilities may, in some embodiments, may, additionally or alternatively, be provided by one or more providers/entities.

In the example of FIG. 1, the facilities are deployed through a machine, service or engine that executes computer software, modules, program codes, and/or instructions on one or more processors which, as noted above, may be part of or external to the platform 100. Merchants may utilize the e-commerce platform 100 for enabling or managing commerce with customers, such as by implementing an e-commerce experience with customers through an online store 138, applications 142A-B, channels 110A-B, and/or through point of sale (POS) devices 152 in physical locations (e.g., a physical storefront or other location such as through a kiosk, terminal, reader, printer, 3D printer, and the like). A merchant may utilize the e-commerce platform 100 as a sole commerce presence with customers, or in conjunction with other merchant commerce facilities, such as through a physical store (e.g., 'brick-and-mortar' retail stores), a merchant off-platform website 104 (e.g., a commerce Internet website or other internet or web property or asset supported by or on behalf of the merchant separately from the e-commerce platform 100), an application 142B, and the like. However, even these 'other' merchant commerce facilities may be incorporated into or communicate with the e-commerce platform 100, such as where POS devices 152 in a physical store of a merchant are linked into the e-commerce platform 100, where a merchant off-platform website 104 is tied into the e-commerce platform 100, such as, for example, through 'buy buttons' that link content from the merchant off platform website 104 to the online store 138, or the like.

The online store 138 may represent a multi-tenant facility comprising a plurality of virtual storefronts. In embodiments, merchants may configure and/or manage one or more storefronts in the online store 138, such as, for example, through a merchant device 102 (e.g., computer, laptop computer, mobile computing device, and the like), and offer products to customers through a number of different channels 110A-B (e.g., an online store 138; an application 142A-B; a physical storefront through a POS device 152; an electronic marketplace, such, for example, through an electronic buy button integrated into a website or social media channel such as on a social network, social media page, social media messaging system; and/or the like). A merchant may sell across channels 110A-B and then manage their sales through the e-commerce platform 100, where channels 110A may be provided as a facility or service internal or external to the e-commerce platform 100. A merchant may, additionally or alternatively, sell in their physical retail store, at pop ups, through wholesale, over the phone, and the like, and then manage their sales through the e-commerce platform 100. A merchant may employ all or any combination of these operational modalities. Notably, it may be that by employing a variety of and/or a particular combination of modalities, a merchant may improve the probability and/or volume of sales. Throughout this disclosure the terms online store 138 and storefront may be used synonymously to refer to a merchant's online e-commerce service offering through the e-commerce platform 100, where an online store 138 may refer either to a collection of storefronts supported by the e-commerce platform 100 (e.g., for one or a plurality of merchants) or to an individual merchant's storefront (e.g., a merchant's online store).

In some embodiments, a customer may interact with the platform 100 through a customer device 150 (e.g., computer, laptop computer, mobile computing device, or the like), a POS device 152 (e.g., retail device, kiosk, automated (self-service) checkout system, or the like), and/or any other commerce interface device known in the art. The e-commerce platform 100 may enable merchants to reach customers through the online store 138, through applications 142A-B, through POS devices 152 in physical locations (e.g., a merchant's storefront or elsewhere), to communicate with customers via electronic communication facility 129, and/or the like so as to provide a system for reaching customers and facilitating merchant services for the real or virtual pathways available for reaching and interacting with customers.

In some embodiments, and as described further herein, the e-commerce platform 100 may be implemented through a processing facility. Such a processing facility may include a processor and a memory. The processor may be a hardware processor. The memory may be and/or may include a transitory memory such as for example, random access memory (RAM), and/or a non-transitory memory such as, for example, a non-transitory computer readable medium such as, for example, persisted storage (e.g., magnetic storage). The processing facility may store a set of instructions (e.g., in the memory) that, when executed, cause the e-commerce platform 100 to perform the e-commerce and support functions as described herein. The processing facility may be or may be a part of one or more of a server, client, network infrastructure, mobile computing platform, cloud computing platform, stationary computing platform, and/or some other computing platform, and may provide electronic connectivity and communications between and amongst the components of the e-commerce platform 100, merchant devices 102, payment gateways 106, applications 142A-B, channels 110A-B, shipping providers 112, customer devices 150, point of sale devices 152, etc. In some implementations, the processing facility may be or may include one or more such computing devices acting in concert. For example, it may be that a plurality of co-operating computing devices serves as/to provide the processing facility. The e-commerce platform 100 may be implemented as or using one or more of a cloud computing service, software as a service (SaaS), infrastructure as a service (IaaS), platform as a service (PaaS), desktop as a service (DaaS), managed software as a service (MSaaS), mobile backend as a service (MBaaS), information technology management as a service (ITMaaS), and/or the like. For example, it may be that the underlying software implementing the facilities described herein (e.g., the online store 138) is provided as a service, and is centrally hosted (e.g., and then accessed by users via a web browser or other application, and/or through customer devices 150, POS devices 152, and/or the like). In some embodiments, elements of the e-commerce platform 100 may be implemented to operate and/or integrate with various other platforms and operating systems.

In some embodiments, the facilities of the e-commerce platform 100 (e.g., the online store 138) may serve content to a customer device 150 (using data 134) such as, for example, through a network connected to the e-commerce platform 100. For example, the online store 138 may serve or send content in response to requests for data 134 from the customer device 150, where a browser (or other application) connects to the online store 138 through a network using a network communication protocol (e.g., an internet protocol). The content may be written in machine readable language and may include Hypertext Markup Language (HTML), template language, JavaScript, and the like, and/or any combination thereof.

In some embodiments, online store 138 may be or may include service instances that serve content to customer devices and allow customers to browse and purchase the various products available (e.g., add them to a cart, purchase through a buy-button, and the like). Merchants may also customize the look and feel of their website through a theme system, such as, for example, a theme system where merchants can select and change the look and feel of their online store 138 by changing their theme while having the same underlying product and business data shown within the online store's product information. It may be that themes can be further customized through a theme editor, a design interface that enables users to customize their website's design with flexibility. Additionally or alternatively, it may be that themes can, additionally or alternatively, be customized using theme-specific settings such as, for example, settings as may change aspects of a given theme, such as, for example, specific colors, fonts, and pre-built layout schemes. In some implementations, the online store may implement a content management system for website content. Merchants may employ such a content management system in authoring blog posts or static pages and publish them to their online store 138, such as through blogs, articles, landing pages, and the like, as well as configure navigation menus. Merchants may upload images (e.g., for products), video, content, data, and the like to the e-commerce platform 100, such as for storage by the system (e.g., as data 134). In some embodiments, the e-commerce platform 100 may provide functions for manipulating such images and content such as, for example, functions for resizing images, associating an image with a product, adding and associating text with an image, adding an image for a new product variant, protecting images, and the like.

As described herein, the e-commerce platform 100 may provide merchants with sales and marketing services for products through a number of different channels 110A-B, including, for example, the online store 138, applications 142A-B, as well as through physical POS devices 152 as described herein. The e-commerce platform 100 may, additionally or alternatively, include business support services 116, an administrator 114, a warehouse management system, and the like associated with running an on-line business, such as, for example, one or more of providing a domain registration service 118 associated with their online store, payment services 120 for facilitating transactions with a customer, shipping services 122 for providing customer shipping options for purchased products, fulfillment services for managing inventory, risk and insurance services 124 associated with product protection and liability, merchant billing, and the like. Services 116 may be provided via the e-commerce platform 100 or in association with external facilities, such as through a payment gateway 106 for payment processing, shipping providers 112 for expediting the shipment of products, and the like.

In some embodiments, the e-commerce platform 100 may be configured with shipping services 122 (e.g., through an e-commerce platform shipping facility or through a third-party shipping carrier), to provide various shipping-related information to merchants and/or their customers such as, for example, shipping label or rate information, real-time delivery updates, tracking, and/or the like.

Figure 2:
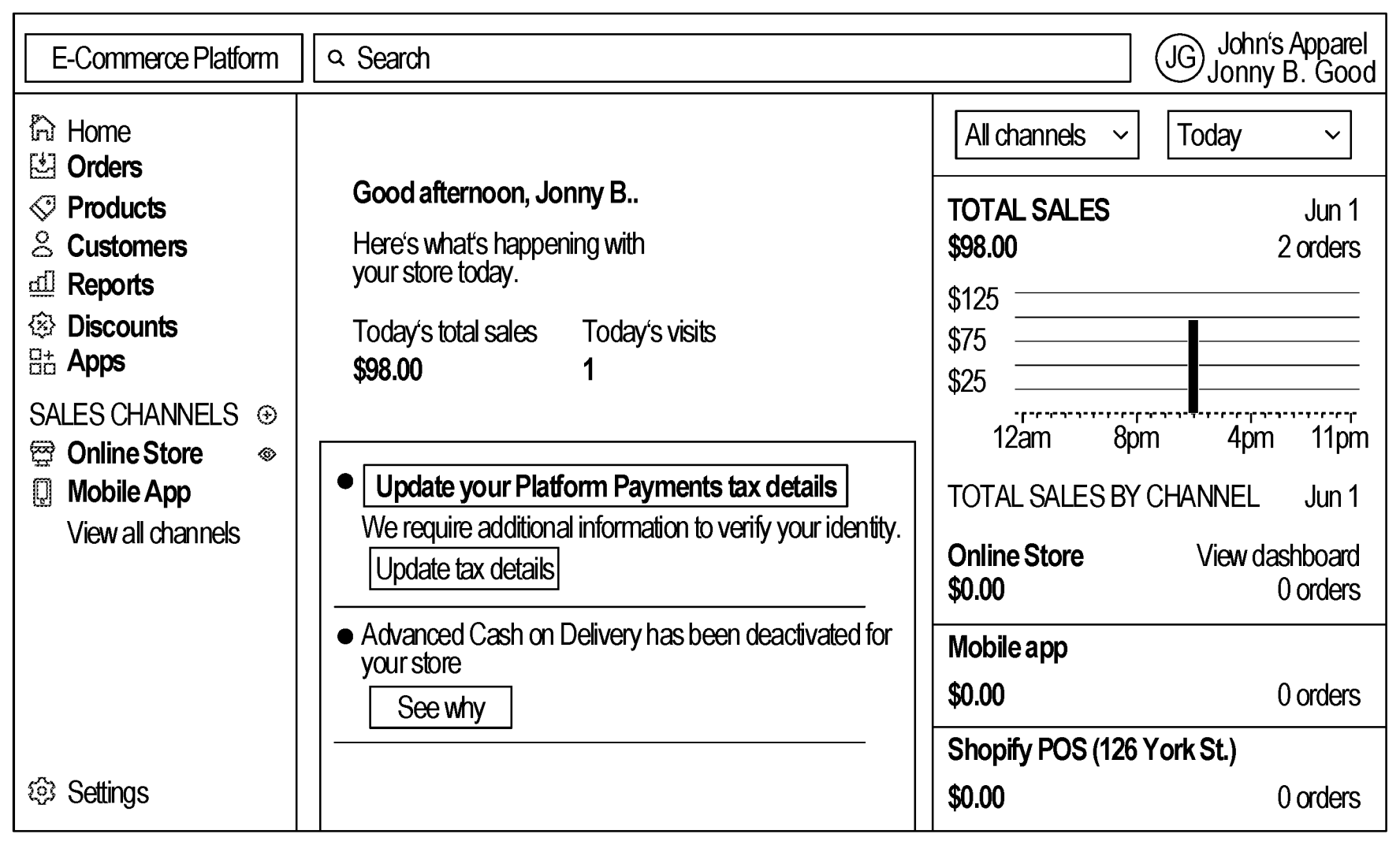

FIG. 2 depicts a non-limiting embodiment for a home page of an administrator 114. The administrator 114 may be referred to as an administrative console and/or an administrator console. The administrator 114 may show information about daily tasks, a store's recent activity, and the next steps a merchant can take to build their business. In some embodiments, a merchant may log in to the administrator 114 via a merchant device 102 (e.g., a desktop computer or mobile device), and manage aspects of their online store 138, such as, for example, viewing the online store's 138 recent visit or order activity, updating the online store's 138 catalog, managing orders, and/or the like. In some embodiments, the merchant may be able to access the different sections of the administrator 114 by using a sidebar, such as the one shown on FIG. 2. Sections of the administrator 114 may include various interfaces for accessing and managing core aspects of a merchant's business, including orders, products, customers, available reports and discounts. The administrator 114 may, additionally or alternatively, include interfaces for managing sales channels for a store including the online store 138, mobile application(s) made available to customers for accessing the store (Mobile App), POS devices, and/or a buy button. The administrator 114 may, additionally or alternatively, include interfaces for managing applications (apps) installed on the merchant's account; and settings applied to a merchant's online store 138 and account. A merchant may use a search bar to find products, pages, or other information in their store.

More detailed information about commerce and visitors to a merchant's online store 138 may be viewed through reports or metrics. Reports may include, for example, acquisition reports, behavior reports, customer reports, finance reports, marketing reports, sales reports, product reports, and custom reports. The merchant may be able to view sales data for different channels 110A-B from different periods of time (e.g., days, weeks, months, and the like), such as by using drop-down menus. An overview dashboard may also be provided for a merchant who wants a more detailed view of the store's sales and engagement data. An activity feed in the home metrics section may be provided to illustrate an overview of the activity on the merchant's account. For example, by clicking on a 'view all recent activity' dashboard button, the merchant may be able to see a longer feed of recent activity on their account. A home page may show notifications about the merchant's online store 138, such as based on account status, growth, recent customer activity, order updates, and the like. Notifications may be provided to assist a merchant with navigating through workflows configured for the online store 138, such as, for example, a payment workflow, an order fulfillment workflow, an order archiving workflow, a return workflow, and the like.

The e-commerce platform 100 may provide for a communications facility 129 and associated merchant interface for providing electronic communications and marketing, such as utilizing an electronic messaging facility for collecting and analyzing communication interactions between merchants, customers, merchant devices 102, customer devices 150, POS devices 152, and the like, to aggregate and analyze the communications, such as for increasing sale conversions, and the like. For instance, a customer may have a question related to a product, which may produce a dialog between the customer and the merchant (or an automated processor-based agent/chatbot representing the merchant), where the communications facility 129 is configured to provide automated responses to customer requests and/or provide recommendations to the merchant on how to respond such as, for example, to improve the probability of a sale.

The e-commerce platform 100 may provide a financial facility 120 for secure financial transactions with customers, such as through a secure card server environment. The e-commerce platform 100 may store credit card information, such as in payment card industry data (PCI) environments (e.g., a card server), to reconcile financials, bill merchants, perform automated clearing house (ACH) transfers between the e-commerce platform 100 and a merchant's bank account, and the like. The financial facility 120 may also provide merchants and buyers with financial support, such as through the lending of capital (e.g., lending funds, cash advances, and the like) and provision of insurance. In some embodiments, online store 138 may support a number of independently administered storefronts and process a large volume of transactional data on a daily basis for a variety of products and services. Transactional data may include any customer information indicative of a customer, a customer account or transactions carried out by a customer such as. for example, contact information, billing information, shipping information, returns/refund information, discount/offer information, payment information, or online store events or information such as page views, product search information (search keywords, click-through events), product reviews, abandoned carts, and/or other transactional information associated with business through the e-commerce platform 100. In some embodiments, the e-commerce platform 100 may store this data in a data facility 134. Referring again to FIG. 1, in some embodiments the e-commerce platform 100 may include a commerce management engine 136 such as may be configured to perform various workflows for task automation or content management related to products, inventory, customers, orders, suppliers, reports, financials, risk and fraud, and the like. In some embodiments, additional functionality may, additionally or alternatively, be provided through applications 142A-B to enable greater flexibility and customization required for accommodating an ever-growing variety of online stores, POS devices, products, and/or services. Applications 142A may be components of the e-commerce platform 100 whereas applications 142B may be provided or hosted as a third-party service external to e-commerce platform 100. The commerce management engine 136 may accommodate store-specific workflows and in some embodiments, may incorporate the administrator 114 and/or the online store 138.

Implementing functions as applications 142A-B may enable the commerce management engine 136 to remain responsive and reduce or avoid service degradation or more serious infrastructure failures, and the like.

Although isolating online store data can be important to maintaining data privacy between online stores 138 and merchants, there may be reasons for collecting and using cross-store data, such as, for example, with an order risk assessment system or a platform payment facility, both of which require information from multiple online stores 138 to perform well. In some embodiments, it may be preferable to move these components out of the commerce management engine 136 and into their own infrastructure within the e-commerce platform 100.

Platform payment facility 120 is an example of a component that utilizes data from the commerce management engine 136 but is implemented as a separate component or service. The platform payment facility 120 may allow customers interacting with online stores 138 to have their payment information stored safely by the commerce management engine 136 such that they only have to enter it once. When a customer visits a different online store 138, even if they have never been there before, the platform payment facility 120 may recall their information to enable a more rapid and/or potentially less-error prone (e.g., through avoidance of possible mis-keying of their information if they needed to instead re-enter it) checkout. This may provide a cross-platform network effect, where the e-commerce platform 100 becomes more useful to its merchants and buyers as more merchants and buyers join, such as because there are more customers who checkout more often because of the ease of use with respect to customer purchases. To maximize the effect of this network, payment information for a given customer may be retrievable and made available globally across multiple online stores 138.

For functions that are not included within the commerce management engine 136, applications 142A-B provide a way to add features to the e-commerce platform 100 or individual online stores 138. For example, applications 142A-B may be able to access and modify data on a merchant's online store 138, perform tasks through the administrator 114, implement new flows for a merchant through a user interface (e.g., that is surfaced through extensions/API), and the like. Merchants may be enabled to discover and install applications 142A-B through application search, recommendations, and support 128. In some embodiments, the commerce management engine 136, applications 142A-B, and the administrator 114 may be developed to work together. For instance, application extension points may be built inside the commerce management engine 136, accessed by applications 142A and 142B through the interfaces 140B and 140A to deliver additional functionality, and surfaced to the merchant in the user interface of the administrator 114.

In some embodiments, applications 142A-B may deliver functionality to a merchant through the interface 140A-B, such as where an application 142A-B is able to surface transaction data to a merchant (e.g., App: "Engine, surface my app data in the Mobile App or administrator 114"), and/or where the commerce management engine 136 is able to ask the application to perform work on demand (Engine: "App, give me a local tax calculation for this checkout").

Applications 142A-B may be connected to the commerce management engine 136 through an interface 140A-B (e.g., through REST (REpresentational State Transfer) and/or GraphQL APIs) to expose the functionality and/or data available through and within the commerce management engine 136 to the functionality of applications. For instance, the e-commerce platform 100 may provide API interfaces 140A-B to applications 142A-B which may connect to products and services external to the platform 100. The flexibility offered through use of applications and APIs (e.g., as offered for application development) enable the e-commerce platform 100 to better accommodate new and unique needs of merchants or to address specific use cases without requiring constant change to the commerce management engine 136. For instance, shipping services 122 may be integrated with the commerce management engine 136 through a shipping or carrier service API, thus enabling the e-commerce platform 100 to provide shipping service functionality without directly impacting code running in the commerce management engine 136.

Depending on the implementation, applications 142A-B may utilize APIs to pull data on demand (e.g., customer creation events, product change events, or order cancelation events, etc.) or have the data pushed when updates occur. A subscription model may be used to provide applications 142A-B with events as they occur or to provide updates with respect to a changed state of the commerce management engine 136. In some embodiments, when a change related to an update event subscription occurs, the commerce management engine 136 may post a request, such as to a predefined callback URL. The body of this request may contain a new state of the object and a description of the action or event. Update event subscriptions may be created manually, in the administrator facility 114, or automatically (e.g., via the API 140A-B). In some embodiments, update events may be queued and processed asynchronously from a state change that triggered them, which may produce an update event notification that is not distributed in real-time or near-real time.

In some embodiments, the e-commerce platform 100 may provide one or more of application search, recommendation and support 128. Application search, recommendation and support 128 may include developer products and tools to aid in the development of applications, an application dashboard (e.g., to provide developers with a development interface, to administrators for management of applications, to merchants for customization of applications, and the like), facilities for installing and providing permissions with respect to providing access to an application 142A-B (e.g., for public access, such as where criteria must be met before being installed, or for private use by a merchant), application searching to make it easy for a merchant to search for applications 142A-B that satisfy a need for their online store 138, application recommendations to provide merchants with suggestions on how they can improve the user experience through their online store 138, and the like. In some embodiments, applications 142A-B may be assigned an application identifier (ID), such as for linking to an application (e.g., through an API), searching for an application, making application recommendations, and the like.

Applications 142A-B may be grouped roughly into three categories: customer-facing applications, merchant-facing applications, integration applications, and the like. Customer-facing applications 142A-B may include an online store 138 or channels 110A-B that are places where merchants can list products and have them purchased (e.g., the online store, applications for flash sales (e.g., merchant products or from opportunistic sales opportunities from third-party sources), a mobile store application, a social media channel, an application for providing wholesale purchasing, and the like). Merchant-facing applications 142A-B may include applications that allow the merchant to administer their online store 138 (e.g., through applications related to the web or website or to mobile devices), run their business (e.g., through applications related to POS devices), to grow their business (e.g., through applications related to shipping (e.g., drop shipping), use of automated agents, use of process flow development and improvements), and the like. Integration applications may include applications that provide useful integrations that participate in the running of a business, such as shipping providers 112 and payment gateways 106.

As such, the e-commerce platform 100 can be configured to provide an online shopping experience through a flexible system architecture that enables merchants to connect with customers in a flexible and transparent manner. A typical customer experience may be better understood through an embodiment example purchase workflow, where the customer browses the merchant's products on a channel 110A-B, adds what they intend to buy to their cart, proceeds to checkout, and pays for the content of their cart resulting in the creation of an order for the merchant. The merchant may then review and fulfill (or cancel) the order. The product is then delivered to the customer. If the customer is not satisfied, they might return the products to the merchant.

In an example embodiment, a customer may browse a merchant's products through a number of different channels 110A-B such as, for example, the merchant's online store 138, a physical storefront through a POS device 152; an electronic marketplace, through an electronic buy button integrated into a website or a social media channel). In some cases, channels 110A-B may be modeled as applications 142A-B. A merchandising component in the commerce management engine 136 may be configured for creating, and managing product listings (using product data objects or models for example) to allow merchants to describe what they want to sell and where they sell it. The association between a product listing and a channel may be modeled as a product publication and accessed by channel applications, such as via a product listing API. A product may have many attributes and/or characteristics, like size and color, and many variants that expand the available options into specific combinations of all the attributes, like a variant that is size extra-small and green, or a variant that is size large and blue. Products may have at least one variant (e.g., a "default variant") created for a product without any options. To facilitate browsing and management, products may be grouped into collections, provided product identifiers (e.g., stock keeping unit (SKU)) and the like. Collections of products may be built by either manually categorizing products into one (e.g., a custom collection), by building rulesets for automatic classification (e.g., a smart collection), and the like. Product listings may include 2D images, 3D images or models, which may be viewed through a virtual or augmented reality interface, and the like.

In some embodiments, a shopping cart object is used to store or keep track of the products that the customer intends to buy. The shopping cart object may be channel specific and can be composed of multiple cart line items, where each cart line item tracks the quantity for a particular product variant.

Since adding a product to a cart does not imply any commitment from the customer or the merchant, and the expected lifespan of a cart may be in the order of minutes (not days), cart objects/data representing a cart may be persisted to an ephemeral data store.

The customer then proceeds to checkout. A checkout object or page generated by the commerce management engine 136 may be configured to receive customer information to complete the order such as the customer's contact information, billing information and/or shipping details. If the customer inputs their contact information but does not proceed to payment, the e-commerce platform 100 may (e.g., via an abandoned checkout component) to transmit a message to the customer device 150 to encourage the customer to complete the checkout. For those reasons, checkout objects can have much longer lifespans than cart objects (hours or even days) and may therefore be persisted. Customers then pay for the content of their cart resulting in the creation of an order for the merchant. In some embodiments, the commerce management engine 136 may be configured to communicate with various payment gateways and services 106 (e.g., online payment systems, mobile payment systems, digital wallets, credit card gateways) via a payment processing component. The actual interactions with the payment gateways 106 may be provided through a card server environment. At the end of the checkout process, an order is created. An order is a contract of sale between the merchant and the customer where the merchant agrees to provide the goods and services listed on the order (e.g., order line items, shipping line items, and the like) and the customer agrees to provide payment (including taxes). Once an order is created, an order confirmation notification may be sent to the customer and an order placed notification sent to the merchant via a notification component. Inventory may be reserved when a payment processing job starts to avoid over-selling (e.g., merchants may control this behavior using an inventory policy or configuration for each variant). Inventory reservation may have a short time span (minutes) and may need to be fast and scalable to support flash sales or "drops", which are events during which a discount, promotion or limited inventory of a product may be offered for sale for buyers in a particular location and/or for a particular (usually short) time. The reservation is released if the payment fails. When the payment succeeds, and an order is created, the reservation is converted into a permanent (long-term) inventory commitment allocated to a specific location. An inventory component of the commerce management engine 136 may record where variants are stocked, and tracks quantities for variants that have inventory tracking enabled. It may decouple product variants (a customer-facing concept representing the template of a product listing) from inventory items (a merchant-facing concept that represents an item whose quantity and location is managed). An inventory level component may keep track of quantities that are available for sale, committed to an order or incoming from an inventory transfer component (e.g., from a vendor).

The merchant may then review and fulfill (or cancel) the order. A review component of the commerce management engine 136 may implement a business process merchant's use to ensure orders are suitable for fulfillment before actually fulfilling them. Orders may be fraudulent, require verification (e.g., ID checking), have a payment method which requires the merchant to wait to make sure they will receive their funds, and the like. Risks and recommendations may be persisted in an order risk model. Order risks may be generated from a fraud detection tool, submitted by a third-party through an order risk API, and the like. Before proceeding to fulfillment, the merchant may need to capture the payment information (e.g., credit card information) or wait to receive it (e.g., via a bank transfer, check, and the like) before it marks the order as paid. The merchant may now prepare the products for delivery. In some embodiments, this business process may be implemented by a fulfillment component of the commerce management engine 136. The fulfillment component may group the line items of the order into a logical fulfillment unit of work based on an inventory location and fulfillment service. The merchant may review, adjust the unit of work, and trigger the relevant fulfillment services, such as through a manual fulfillment service (e.g., at merchant managed locations) used when the merchant picks and packs the products in a box, purchase a shipping label and input its tracking number, or just mark the item as fulfilled. Alternatively, an API fulfillment service may trigger a third-party application or service to create a fulfillment record for a third-party fulfillment service. Other possibilities exist for fulfilling an order. If the customer is not satisfied, they may be able to return the product(s) to the merchant. The business process merchants may go through to "un-sell" an item may be implemented by a return component. Returns may consist of a variety of different actions, such as a restock, where the product that was sold actually comes back into the business and is sellable again; a refund, where the money that was collected from the customer is partially or fully returned; an accounting adjustment noting how much money was refunded (e.g., including if there was any restocking fees or goods that weren't returned and remain in the customer's hands); and the like. A return may represent a change to the contract of sale (e.g., the order), and where the e-commerce platform 100 may make the merchant aware of compliance issues with respect to legal obligations (e.g., with respect to taxes). In some embodiments, the e-commerce platform 100 may enable merchants to keep track of changes to the contract of sales over time, such as implemented through a sales model component (e.g., an append-only date-based ledger that records sale-related events that happened to an item).

Product Bundles

A product bundle (or "product kit") is a set of multiple different products that are sold together as a single unit. The products in a product bundle, which are also referred to as "items", may include different product variants. Examples of different product variants include different colors and/or flavours of the same product. The products in a product bundle may be complementary to each other or otherwise associated with each other. For example, a product bundle may relate to a single type of product (e.g., a bundle of cosmetic products). A product bundle may also or instead include products that are used together (e.g., a bicycle repair kit). In some cases, a product bundle has specific packaging, product arrangement and/or labelling associated with it. The price of a product bundle may be less than the combined price of each individual item in the bundle, which provides an incentive for customers to purchase the product bundle. Further, product bundles may simplify the shopping experience by relieving some decision making for customers. A customer may only have to choose one product bundle in an online store, rather than choose multiple individual products. Potential advantages of implementing product bundles from the perspective of a merchant include increased overall sales, simplified product packaging and/or simplified product distribution.

The products included in a product bundle may be selected in any of a number of different ways. For example, product bundles may be selected by merchants and/or by customers (e.g., through requests sent from the merchant device 102 and/or the customer device 150 to the e-commerce platform 100). Product bundles may also or instead be recommended by a computing system (e.g., recommended by the e-commerce platform 100 and/or by the applications 142B). Merchant-selected product bundles may include products that are chosen by a merchant based on the merchant's knowledge of those products and/or based on the merchant's knowledge of their customer base. Customer-selected product bundles include products that are chosen by a customer. For example, a merchant may offer a discount for purchasing a product bundle with a certain number of items but might not specify the exact products in the product bundle. A customer might then select the products for the product bundle from a set of products that are sold by the merchant. System-recommended product bundles may include products that are chosen by an e-commerce platform or another computing system based on customer behaviour. For example, using transactional data stored in the data facility 134, the e-commerce platform 100 may detect that a set of products are frequently purchased together and may recommend a product bundle that includes those products. In another example, a computing system may parse references to a merchant's products on social media platforms and/or on other forums to determine sets of products that are being recommended by users (e.g., by social media "influencers"). The system might then recommend product bundles based on those sets of products. System-recommended product bundles may be subject to approval and/or modification by a merchant. For example, a suggested product bundle may be indicated to a merchant via their account on the e-commerce platform 100. The merchant may then review, modify and/or approve the product bundle for sale in their online store.

A product bundle may be presented to customers using product media that represents the products in the product bundle. While it may be possible to present a product bundle to a customer using multiple discrete instances of product media, where each instance depicts a different product in the product bundle, this might not present the product bundle in a cohesive manner. For example, multiple discrete instances of product media may fail to convey the collective aesthetics and/or functionality of the product bundle. Further, implementing multiple instances of product media in a product page and/or an online advertisement might result in a relatively large bandwidth requirement for transmitting the product page and/or the online advertisement to a user device. Therefore, it may be desirable to present a product bundle using dedicated product media. Dedicated product media for a product bundle may be an image, a video, and/or a 3D model that depicts each product in the product bundle together, optionally using an appealing arrangement and/or a relevant background. Dedicated product media for a product bundle may increase customer appeal and sales conversion for the product bundle (e.g., increase the number of product bundles sold). Dedicated product media might also reduce the amount of data that is transmitted over a network, as compared to the transmission of multiple discrete instances of product media, for example.

Generating dedicated product media for product bundles may be resource-intensive for a merchant. For example, an e-commerce platform might frequently suggest new product bundles based on changes in season, customer trends and/or a merchant's available products. Customer-selection of a product bundle in an online store might also enable many different product bundle variations to be created. In this way, an e-commerce platform may allow an online store to rapidly implement new product bundles and/or to flexibly implement different product bundle variations. It may be expensive and even impractical for a merchant to manually generate dedicated product media for each product bundle sold via their online store. Accordingly, a need exists for systems and methods that can rapidly and flexibly generate dedicated product media for product bundles, to help match the rapid and flexible creation of product bundles that is possible through e-commerce.

Figure 3:
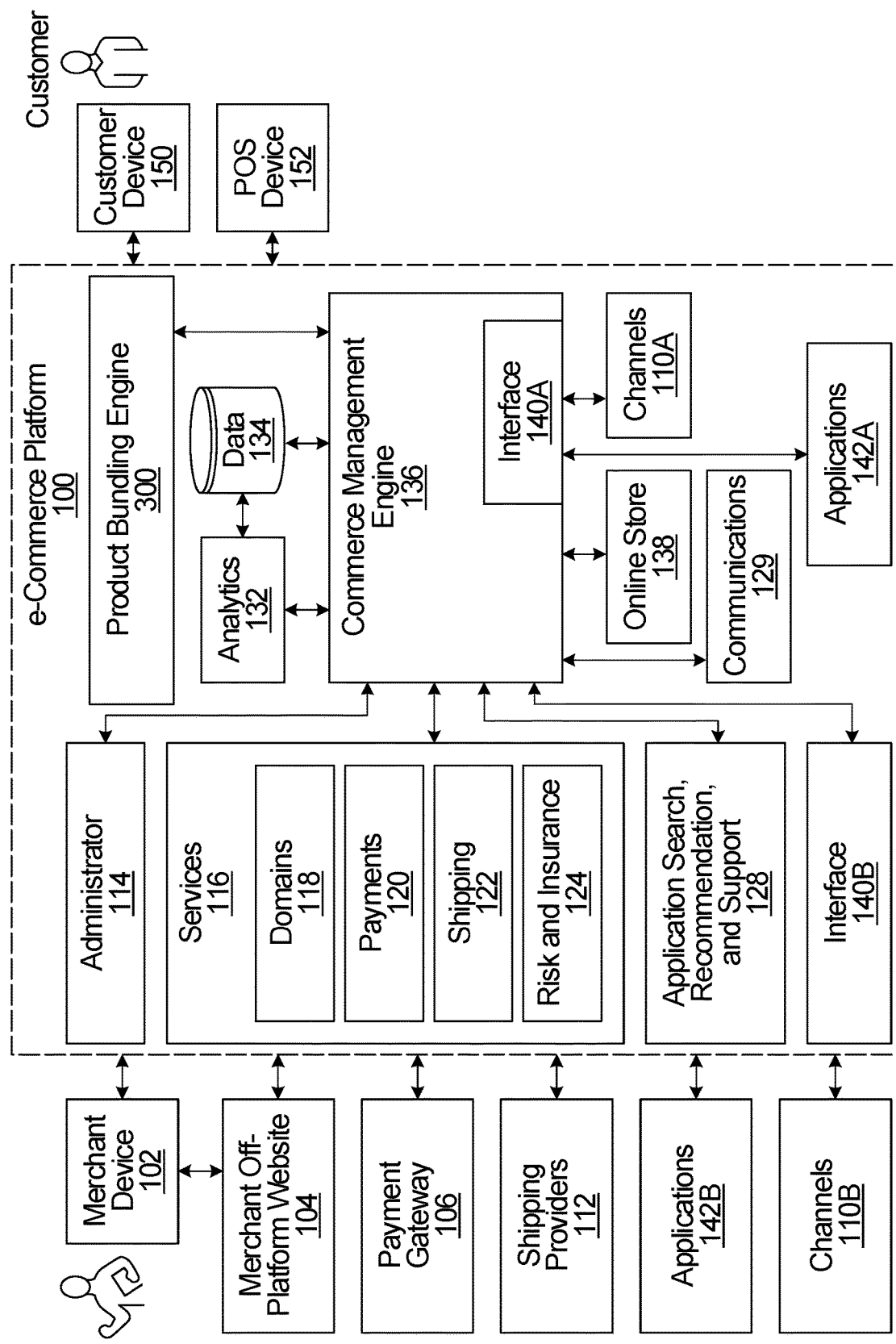
FIG. 3 illustrates the e-commerce platform of FIG. 1, but including a product bundling engine.

FIG. 3 illustrates the e-commerce platform 100 of FIG. 1, but including a product bundling engine 300. The product bundling engine 300 is an example of a computer-implemented system that can generate product media related to product bundles. For example, the product bundling engine 300 may generate product media for display on product pages of the online store 138. The product media may be generated automatically by the product bundling engine 300 in response to the product bundle being selected by a merchant or by a customer, or in response to the product bundle being suggested by the e-commerce platform 100 or another computing system.

In some implementations, the product bundling engine 300 may be at least partially responsible for creating and/or suggesting product bundles at the e-commerce platform 100. For example, using historical sales data obtained from the data facility 134, the product bundling engine 300 may generate a potential product bundle for a merchant based on previous customer behaviour (e.g., products sold by the merchant that are commonly purchased together). The product bundling engine 300 might then automatically generate product media for the product bundle and present the product media to the merchant with a suggestion to implement the product bundle in their online store. The product media may help the merchant visualize the suggested product bundle, potentially allowing the merchant to make a more informed decision regarding the implementation of the product bundle in their online store.

The automatic generation of product media by the product bundling engine 300 may improve the overall efficiency of product media generation at the e-commerce platform 100, and optionally reduce cost and effort on behalf of merchants. For example, a merchant may use the product bundling engine 300 to generate dedicated product media for their product bundles, rather than manually generating the product media. The product bundling engine 300 may also help conserve computational resources at the e-commerce platform 100. Automatically producing digital media using the product bundling engine 300 may mean that less product media needs to be stored at the e-commerce platform 100 at any given time, which may help conserve computer storage resources. When product media is needed for display on a product page of the online store 138, for example, this product media may be actively generated by the product bundling engine 300 rather than being obtained from memory.

Consider a case in which a merchant offers a product bundle for sale online that includes any three products selected from a set of ten possible products. Once a customer selects three products for their bundle, the merchant may wish to present dedicated product media for that product bundle to the customer during a checkout process, for example. This may provide the customer with an aesthetically pleasing depiction of the selected products and motivate the customer to complete the checkout process. However, there exist 120 possible combinations of three products selected from the ten possible products. Storing dedicated product media for each of the 120 possible combinations may be resource intensive. As such, using the product bundling engine 300 to actively generate product media for a particular combination of products selected by a customer may conserve storage resources. Further, the product media may be generated in real-time as the customer selects the product, potentially providing the customer with a visual representation of their product bundle being assembled.

Although the product bundling engine 300 is illustrated as a distinct component of the e-commerce platform 100 in FIG. 3, this is only an example. A product bundling engine could also or instead be provided by another component residing within or external to the e-commerce platform 100. In some embodiments, either or both of the applications 142A-B provide a product bundling engine that implements the functionality described herein to make it available to customers and/or to merchants. Furthermore, in some embodiments, the commerce management engine 136 provides that product bundling engine. However, the location of the product bundling engine 300 is implementation specific. In some implementations, the product bundling engine 300 is provided at least in part by an e-commerce platform, either as a core function of the e-commerce platform or as an application or service supported by or communicating with the e-commerce platform. Alternatively, the product bundling engine 300 may be implemented as a stand-alone service to clients, such as a customer device 150 or a merchant device 102. In addition, at least a portion of such a product bundling engine could be implemented in the merchant device 102 and/or in the customer device 150. For example, the customer device 150 could store and run a product bundling engine locally as a software application. This software application could be a tool that resides off of the e-commerce platform 100, such as, for example, a desktop application or mobile application.

As discussed in further detail below, the product bundling engine 300 could implement at least some of the functionality described herein. Although the embodiments described below may be implemented in association with an e-commerce platform, such as (but not limited to) the e-commerce platform 100, the embodiments described below are not limited to e-commerce platforms.

3D Composite Models of Product Bundles

In some embodiments, dedicated product media depicting a product bundle is generated using pre-existing 3D models that correspond to the products included in the product bundle. These pre-existing 3D models may already be implemented in product pages of a merchant's online store, for example. Each pre-existing 3D model could represent an individual product or a group of products belonging to the product bundle. The 3D models could be combined to form a single 3D composite model that includes representations of each of the products. For example, the 3D models might be placed within a common virtual space to form a 3D scene depicting each of the products. As such, the generation of the 3D composite model of the product bundle might not involve any resource-intensive 3D scanning and/or graphical designing. The 3D composite model might be used to help present the product bundle to customers. For example, a customer may be able to view and interact with the 3D composite model through a product page of an online store. The 3D composite model might also or instead be rendered to create images and/or videos that are presented on the product page. In this way, a 3D composite model may provide one or more dedicated instances of product media depicting a product bundle.

Using a 3D composite model to depict each of the products in a product bundle within the same scene may provide more cohesive representation of the product bundle. For example, the products may be depicted under the same lighting conditions and/or using a contextually relevant background. In some cases, this background may be specific to a particular customer to create personalized product media. Renders of the 3D composite model may depict occlusion of one product by another product, to reinforce the impression that the products are included in the same scene.

A 3D composite model may be generated automatically by an e-commerce platform (e.g., by the e-commerce platform 100) in response to a new product bundle being created or recommended. For example, the creation of a new product bundle may trigger an e-commerce platform to obtain 3D models of each of the products in the product bundle. The 3D models may be obtained from a database of pre-existing product media stored at the e-commerce platform. Once the 3D models are obtained, the 3D composite model may be generated based on the 3D models. Consider a case in which the e-commerce platform generates a recommendation for a new product bundle based on customer behavior, for example. Before proposing the new product bundle to a merchant, the e-commerce platform might obtain a 3D model of each of the products in the product bundle from a database. The e-commerce platform might then generate a 3D composite model based on the obtained 3D models and present the 3D composite model (or a render of the 3D composite model) to the merchant with the proposed product bundle. This may help the merchant visually assess the product bundle before deciding whether or not to implement the product bundle in their online store.

In some implementations, a 3D composite model may be generated in real-time as a user selects products to be included in a product bundle. Consider a case in which a merchant is selecting products for a product bundle via their account on an e-commerce platform. Each time that the merchant selects a product, the e-commerce platform may obtain a 3D model of that product from a database. The 3D model may then be added to a 3D composite model of the product bundle. The 3D composite model may be presented to the merchant while the merchant is creating the product bundle, which may allow the merchant to appreciate the look of the product bundle as products are selected in real-time. When a product is removed from the product bundle, the representation of that product may also be removed from the 3D composite model in real-time. The e-commerce platform may update the 3D composite model rapidly in response to the selection and/or removal of products from the product bundle, to limit latency for the merchant. Similar comments may apply to when other users are generating a product bundle. For example, a 3D composite model may be generated in real-time as a customer selects products for a product bundle in a merchant's online store.

Example Systems and Methods for Generating 3D Composite Models

Figure 4:
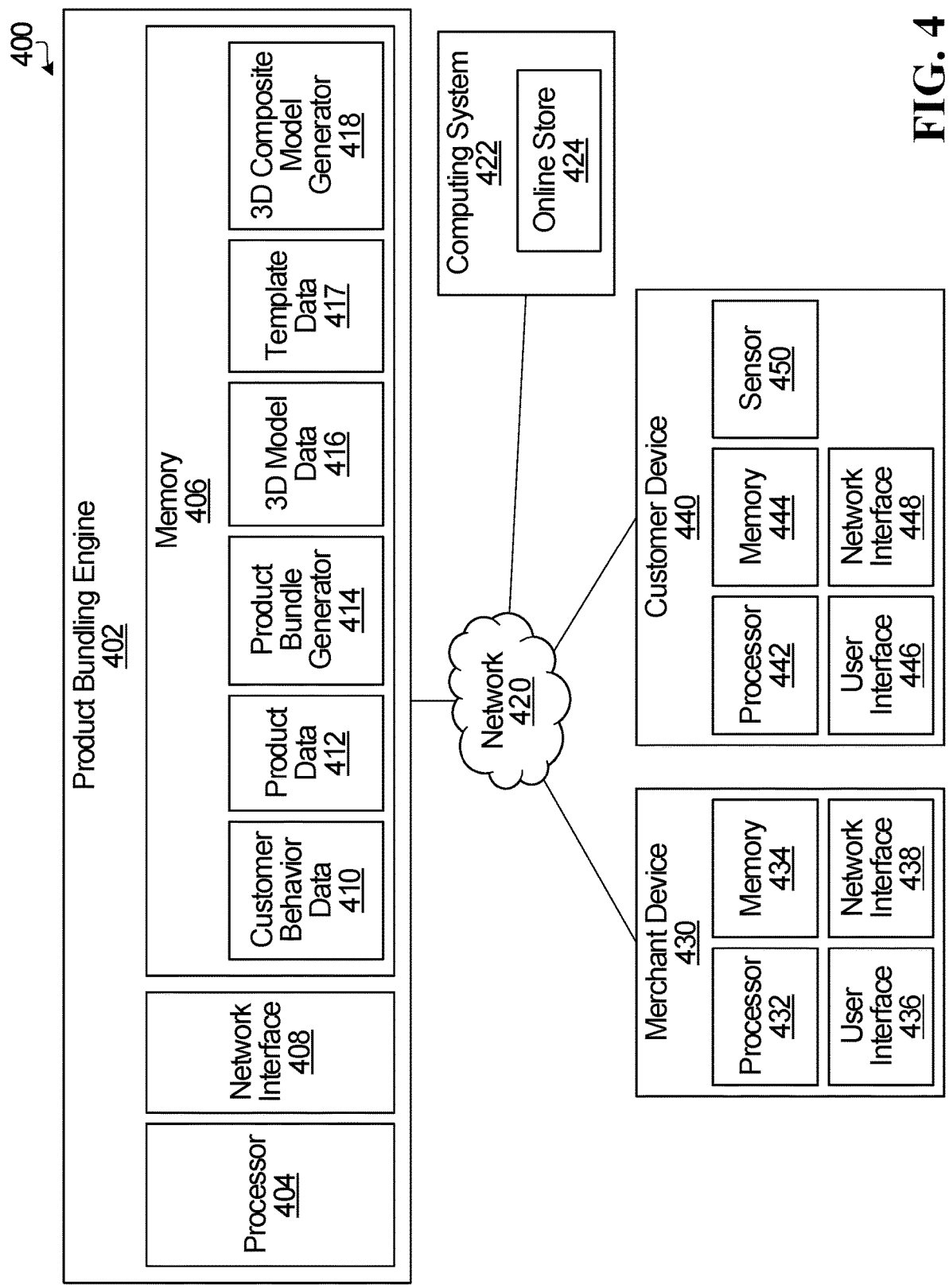
FIG. 4 is a block diagram illustrating a system for generating 3D composite models of product bundles, according to an embodiment.

FIG. 4 is a block diagram illustrating a system 400 for generating 3D composite models of product bundles, according to an embodiment. The system 400 includes a product bundling engine 402, a network 420, a computing system 422, a merchant device 430 and a customer device 440.

The computing system 422 supports, hosts or otherwise implements an online store 424, which might also or instead be an online marketplace. In this way, the online store 424 is an example of a software instance on the computing system 422. The structure of the computing system 422 is implementation specific. The computing system 422 may include a processor, memory, server, client, network interface, network infrastructure, mobile computing platform, cloud computing platform and/or stationary computing platform, for example. Optionally, the computing system 422 is (or is part of) an e-commerce platform. For example, the computing system 422 may be similar to the e-commerce platform 100, and the online store 424 may be similar to the online store 138.

In some implementations, the online store 424 is owned and/or operated by a merchant associated with the merchant device 430. For example, the merchant device 430 may exchange hypertext transfer protocol (HTTP) messages with the computing system 422 to manage the online store 424. The merchant device 430 may be a mobile phone, tablet, laptop, headset, smart watch, television, POS device or computer, for example.

The customer device 440 may also be, for example, a mobile phone, tablet, laptop, headset, smart watch, television, POS device or computer owned and/or used by a customer. The customer may be a previous, current, and/or potential customer of the online store 424. For example, the customer device 440 may exchange HTTP messages with the computing system 422 to navigate the online store 424. Optionally, the customer device 440 may be signed-on to an account with the online store 424 so that the identity of the customer is known to the computing system 422.

As illustrated, the merchant device 430 includes a processor 432, memory 434, user interface 436 and network interface 438. The customer device 440 also includes a processor 442, memory 444, user interface 446 and network interface 448, and further includes a sensor 450. The customer device 440 will be described by way of example below. However, it should be noted that the merchant device 430 may be implemented in the same or a similar way.

The user interface 446 may include, for example, a display screen (which may be a touch screen and/or a transparent display screen), a gesture recognition system, a speaker, headphones, a microphone, haptics, a keyboard, and/or a mouse. The user interface 446 may receive user input from a user (e.g., using the keyboard and/or the mouse). The user interface 446 may also or instead present digital content to a user, including visual, haptic and/or audio content. In some implementations, the customer device 440 includes implanted devices or wearable devices, such as a device embedded in clothing material, or a device that is worn by a user, such as glasses.

The network interface 448 is provided for communicating over the network 420. The structure of the network interface 448 will depend on how the customer device 440 interfaces with the network 420. For example, if the customer device 440 is a mobile phone or tablet, then the network interface 448 may include a transmitter/receiver with an antenna to send and receive wireless transmissions to/from the network 420. If the customer device 440 is a personal computer connected to the network with a network cable, then the network interface 448 may include, for example, a network interface card (NIC), a computer port (e.g., a physical outlet to which a plug or cable connects), and/or a network socket.

The processor 442 directly performs or instructs all of the operations performed by the customer device 440. Examples of these operations include processing user inputs received from the user interface 446, preparing information for transmission over the network 420, processing data received over the network 420, and instructing a display screen to display information. The processor 442 may be implemented by one or more processors that execute instructions stored in the memory 444. Alternatively, some or all of the processor 442 may be implemented using dedicated circuitry, such as an application specific integrated circuit (ASIC), a graphics processing unit (GPU) or a programmed field programmable gate array (FPGA).

The sensor 450 may enable photography, videography, distance measurements, 3D scanning and/or 3D mapping (e.g., simultaneous localization and mapping (SLAM)) at the customer device 440. For example, the sensor 450 may include one or more cameras, radar sensors, lidar sensors, sonar sensors, accelerometers, gyroscopes, magnetometers and/or satellite positioning system receivers (e.g., global positioning system (GPS) receivers). Measurements obtained by the sensor 450 may help to enable augmented reality (AR), mixed reality (MR) and/or extended reality (XR) experiences on the customer device 440. Although the sensor 450 is shown as a component of the customer device 440, at least a portion of the sensor 450 may also or instead be implemented separately from the customer device 440 and may communicate with the customer device 440 via wired and/or wireless connections, for example.

The network 420 may be a computer network implementing wired and/or wireless connections between different devices, including any two or more of the product bundling engine 402, the computing system 422, the merchant device 430 and the customer device 440, for example. The network 420 may implement any communication protocol known in the art. Non-limiting examples of communication protocols include a local area network (LAN), a wireless LAN, an internet protocol (IP) network, and a cellular network.

In FIG. 4, the number of merchant and customer devices are shown by way of example. Any number of merchant devices and customer devices may be implemented in the system 400. In addition, any number of online stores may be implemented in the system 400.

The product bundling engine 402 is configured to suggest product bundles and generate product media depicting product bundles. The product bundling engine 402 includes a processor 404, memory 406, and a network interface 408. The processor 404 may be implemented by one or more processors that execute instructions stored in the memory 406 or in another non-transitory computer readable medium. These instructions could implement any method described herein. Alternatively, some or all of the processor 404 may be implemented using dedicated circuitry, such as an ASIC, a GPU, or a programmed FPGA. The network interface 408 is provided for communication over the network 420. The structure of the network interface 408 is implementation specific. For example, the network interface 408 may include a NIC, a computer port, and/or a network socket.

As illustrated in FIG. 4, the product bundling engine 402 and the computing system 422 are separate. However, in some implementations, the product bundling engine 402 and the computing system 422 may be at least partially combined. For example, the computing system 422 may implement both the product bundling engine 402 and the online store 424. In some implementations, a product bundling engine is provided at least in part by an e-commerce platform, either as a core function of the e-commerce platform or as an application or service supported by or communicating with the e-commerce platform. The online store 424 may also be provided by this e-commerce platform. While the product bundling engine 402 is shown as a single component, a product bundling engine could instead be provided by multiple different components that are in communication via a network.

As illustrated, the memory 406 stores customer behaviour data 410, product data 412, a product bundle generator 414, 3D model data 416, template data 417, and a 3D composite model generator 418.

The customer behaviour data 410, the product data 412, and the product bundle generator 414 may be used in combination to suggest new product bundles and/or to suggest updates to existing product bundles for merchants. The customer behaviour data 410 may include information pertaining to the online shopping habits of one or more customers, and the product data 412 may include information pertaining to the properties of one or more products sold online. The customer behaviour data 410 and/or the product data 412 may be analysed by the product bundle generator 414 to obtain a suggestion for a product bundle. For example, the product bundle generator 414 may include and/or implement one or more algorithms (possibly in the form of software instructions executable by the processor 404) to analyse the customer behaviour data 410 and/or the product data 412 and output a suggested product bundle.

In some implementations, the product bundle generator 414 may include a set of defined conditions for suggesting a product bundle. For example, a merchant may define conditions for suggesting product bundles that include their products. If a threshold number of the conditions are met (e.g., one or more conditions, two or more conditions, etc.) by a set of two or more products, then the product bundle generator 414 may output an indication that the set of two or more products could be bundled. The conditions may be defined in terms of customer behaviour and/or product data. For example, the product bundle generator 414 may compare the conditions to the customer behaviour data 410 and/or to the product data 412 to determine if a set of products should be suggested as a product bundle. Examples of defined conditions for suggesting a product bundle are provided elsewhere herein.

Alternatively or additionally, the product bundle generator 414 may include and/or implement machine learning algorithms and other predictive algorithms to help suggest product bundles. For example, a training data set may be formed using customer behaviour data and/or product data pertaining to the products in multiple merchant-selected product bundles. A machine learning (ML) model may then be trained using the training data set. Once trained, the ML model may analyse the customer behaviour data 410 and/or the product data 412, and output suggestions for product bundles. Non-limiting examples of ML model structures include artificial neural networks, decision trees, support vector machines, Bayesian networks, and genetic algorithms. Non-limiting examples of training methods for an ML model include supervised learning, unsupervised learning, reinforcement learning, self-learning, feature learning, and sparse dictionary learning.

The customer behaviour data 410 (which could, more generally, be considered "customer data" or "buyer data") may be used by the product bundle generator 414 to detect products that are in some way linked or correlated by the online shopping habits of customers. The correlation between these products may indicate that the products are candidates for a product bundle. Non-limiting examples of information that may be included in the customer behaviour data 410 are provided below.

Product sales data, which may record the sales of one or more products over time. In some implementations, the product sales data may include data related to product orders placed in an online store, an online marketplace, and/or a brick-and-mortar store. A condition for suggesting a product bundle might be a detected correlation between two or more products based on the product sales data. For example, the product sales data may indicate correlations between products that are commonly purchased together in the same order. Alternatively or additionally, the product sales data may identify products based on relative sales indicators (e.g., identifying products as high-selling products or as low-selling products). A condition for suggesting a product bundle might be to combine a high-selling product and a low-selling product, to potentially increase sales of the low-selling product.

Web traffic data, which may include product page views in an online store and/or in an online marketplace, the date and time of the product page views, the length of the product page views (e.g., the amount of time a customer spends viewing a product page), and search results that match a product page, for example. The web traffic data may also or instead include customers adding products to their shopping cart. The web traffic data may indicate correlations between two or more products. For example, customers may view the respective product pages of different products in close succession, indicating that the products may be related. A condition for suggesting a product bundle may be a detected correlation between two or more products based on the web traffic data.

Customer review data and social media data, which may include reference to one or more products. This data may indicate a correlation between two or more products based on them being recommended by the same user and/or being recommended in the same post, for example. A condition for suggesting a product bundle may be a detected correlation between two or more products based on the customer review data and/or the social media data.

Customer attributes, which may include static or pre-determined data for different customers. Non-limiting examples of customer attributes include body metrics (e.g., shoe size), skin tone (e.g., to help select complimentary clothing colors), and dietary preferences (e.g., a savoury/sweet preference).

In some implementations, at least a portion of the customer behaviour data 410 may be specific to one or more customers. This may help generate "personalized product bundles" that include products selected in a customer-specific manner. For example, the information in the customer behaviour data 410 may be organized in terms of different customers of the online store 424 (e.g., previous customers of the online store 424 and/or registered customer accounts on the online store 424). The customer behaviour data 410 may also or instead relate to customers and/or customer accounts of other online stores, online marketplaces, and/or e-commerce platforms. The portion of the customer behaviour data 410 relating to a particular customer may be input into the product bundle generator 414 to obtain a personalized product bundle for that customer.

In some implementations, at least a portion of the customer behaviour data 410 may relate to one or more different geographic regions. This may help detect correlated products for different regions and suggest product bundles in a region-specific manner. For example, customer behaviour may vary between cities and/or countries, and product bundles could be suggested to reflect those differences. Customer behaviour may be assigned to a geographic region in any of a variety of different manners. For example, product sales data may be assigned a geographic region based on a shipping address, a billing address and/or another known address for a product order. The geographic region of the product order may also or instead be determined based on the internet protocol (IP) address of a customer device.

The product data 412 includes information regarding products sold through the online store 424 and/or through other online stores, online marketplaces, and/or e-commerce platforms. The product data 412 may be used by the product bundle generator 414 to help create product bundles that include similar and/or complementary products. Non-limiting examples of information that may be included in the product data 412 are provided below.

- The type, category, or class of one or more products. A condition for a suggesting product bundle may be that the products belong to a common product category. As an example, a product bundle may include shampoo, conditioner, and hair oil all falling within a merchant's "hair product" category. As another example, a product bundle may include three varieties of coffee beans.
- Product advertising data, such as an advertising spend and/or an advertising budget for one or more products, for example. The product advertising data may identify products based on relative advertising indicators (e.g., identifying products as highly advertised products or as lesser advertised products). A condition for suggesting a product bundle might be to combine highly advertised products and lesser advertised products. For example, a product bundle may be suggested that leverages the high advertising budget for a highly advertised product to help increase sales of a lesser advertised product.
- Release date for one or more products, which may identify products as being "newly released products" or "classic products". Product release dates may be used to create product bundles that introduce customers to new products. In some cases, a condition for a product bundle might be to combine a newly released product with one or more classic products. For example, a newly released flavour of sauce may be combined with one or more classic sauce flavours.
- Inventory for one or more products, which may identify products based on their relative levels of inventory (e.g., identify products as having "high inventory", "normal inventory", or "low inventory"). A condition for suggesting a product bundle might be to include one or more products with a high inventory. For example, a low-selling product with high inventory may be bundled with one or more high-selling items in order to help clear inventory of the low-selling product.
- Dimensional data and/or shipping restrictions for one or more products. This information may help filter out products that would be difficult to co-package based on the product size or shipping requirements. In some cases, a breakable item may have particular shipping and packaging requirements that make it unsuitable for inclusion in a product bundle. In some cases, product items like foodstuffs may be unsuitable for inclusion in a product bundle, perhaps due to delivery or shipping restrictions or packaging restrictions. A condition for suggesting a product bundle might be to not include products having unsuitable product dimensions or shipping restrictions.

At least some of the customer behaviour data 410 and/or product data 412 may be obtained from databases associated with online stores, such as the online store 424, for example. The customer behaviour data 410 and/or product data 412 may also or instead be obtained from databases associated with an online marketplace, an e-commerce platform and/or a social media platform. Alternatively or additionally, the customer behaviour data 410 and/or product data 412 may be provided through direct merchant input using, for example, the merchant device 430. The customer behaviour data 410 and/or product data 412 may be stored using any of a variety of different data structures, including a list, an array (of any dimension) and/or a data tree, for example.

The 3D model data 416, the template data 417, and the 3D composite model generator 418 may be used to create 3D composite models of product bundles. These product bundles may be suggested by the product bundle generator 414, selected by a merchant via user input at the merchant device 430, and/or selected by a customer via user input at the customer device 440, for example. The generated 3D composite models might then be transmitted to the computing system 422 to provide product media depicting the product bundles sold via the online store 424. In some cases, a 3D composite model and/or a render of the 3D composite model might be served to the customer device 440 in response to an HTTP request for the product page of a product bundle sold in the online store 424.

The 3D model data 416 may include one or more 3D models of different products. Each 3D model may represent a single product or multiple products. These products may be sold online by one or more merchants through one or more online stores and/or online marketplaces (e.g., be sold through the online store 424). A 3D model is a mathematical representation of an object that is defined with a length, width and height. A 3D model may be placed or otherwise defined within a virtual space having a 3D coordinate system, which could be a cartesian coordinate system, a cylindrical coordinate system or a polar coordinate system, for example. In some implementations, a 3D model may include a mesh (e.g., a polygonal mesh) defining the shape of an object, a texture map defining the surface appearance of the object, and/or virtual lighting representing real-world and/or computer-generated lighting conditions for the object. Other implementations of a 3D model are also contemplated, including solid models and point clouds, for example. In addition to providing a visual representation of an object, a 3D model may also have associated audio content and/or haptic content. For example, the 3D model data 416 could store sounds made by or otherwise associated with an object and/or haptic feedback that can simulate the feel of an object.

The 3D model data 416 may store 3D models in any of a variety of different formats, including GLTF, GLB, USDZ, STL, OBJ, FBX, COLLADA, 3DS, IGES, STEP, and VRML/X3D. The 3D model files may be read and/or rendered on a display device via 3D software such as Autodesk Maya™, Autodesk 3DS Max™ and SOLIDWORKS™, for example.

It should be noted that a 3D model of an object includes a representation of the object but is not limited to that object. The 3D model may represent other objects and/or entities, including light sources and/or background objects, for example. As such, the phrase "3D model of X" does not limit the 3D model to only representing X.

The 3D models in the 3D model data 416 could be obtained in any of a number of different ways. At least some of the 3D models may be obtained from the computing system 422 and/or from the merchant device 430. Some 3D models may also or instead be obtained from other computing systems, such as e-commerce platforms and/or social media platforms, for example. In some implementations, a merchant could generate 3D models of any, one, some or all of the products sold in the online store 424. A 3D model may be generated manually via user input at a user device and/or may be generated based on measurements of a real-world object. Possible methods for generating 3D models from a real-world object include photogrammetry and 3D scanning. The 3D models generated by a merchant may be provided directly to the product bundling engine 402 by the merchant device 430. Alternatively or additionally, the 3D models may be stored on the computing system 422 for implementation in the online store 424, and the product bundling engine 402 may obtain the 3D models from the computing system 422.

The template data 417 includes one or more 3D model templates, which are also referred to as "templates", that may be used to create 3D composite models. A template for a 3D composite model may include, for example, a defined arrangement of items in the 3D composite model and/or background content for the items in the 3D composite model. Generating a 3D composite model using a template may be thought of as adding or incorporating 3D models into the template to obtain the 3D composite model.

The arrangement of items in a 3D composite model may be used to determine the relative placement of each item within a virtual space of the 3D composite model. For example, the items may be arranged in a row, stacked like boxes, or arranged to demonstrate how the items may be used in combination (e.g., multiple articles of clothing in a product bundle could be arranged to depict an outfit). In some implementations, an arrangement of items includes a respective location and/or orientation for each of the 3D models corresponding to a product bundle, which may define the placement of the 3D models relative to each other and/or relative to background content in a 3D composite model. For example, each 3D model may be assigned a coordinate and/or a vector defined within a virtual coordinate system of the 3D composite model. Optionally, an arrangement of items could vary as a function of time to create an animated 3D composite model. For example, the position and orientation of a 3D model could change to simulate movement of a corresponding item.

The background content for a 3D composite model may simulate a virtual scene or environment surrounding the representations of items in the 3D composite model. This background content may include visual, audio and/or haptic content that is separate from the 3D models corresponding to the items. In some cases, background content may be implemented to provide a contextually relevant scene for a product bundle represented by a 3D composite model. By way of example, background content simulating the appearance and/or sounds of a campsite may be applied to a 3D composite model of a product bundle related to camping equipment. In another example, a 3D composite model of a product bundle related to kitchen appliances might implement background content depicting a 3D kitchen counter.

Background content for a 3D composite model may include background images, such as images depicting a particular setting, for example. These images may be mapped to 3D surfaces in the 3D composite model. In some cases, the background content may include an environment map. This environment map could include a series of images of an environment that are combined to provide a cohesive digital representation of the environment. The images may be organized to form the interior surfaces of a sphere or cube depicting the environment. 3D models of items may be placed within the sphere or cube to simulate that environment surrounding the items. Alternatively or additionally, background content for a 3D composite model may include 3D models of background objects, background sounds, and/or virtual lighting. Virtual lighting may be used to simulate the illumination of items when rendering the 3D composite model. This may include calculating the properties of light (e.g., the light color and/or intensity) that is incident on virtual surfaces defined by the 3D composite model and performing shading to calculate how each virtual surface appears as a result of that illumination. For example, shading may simulate various light interactions on the items represented by a 3D composite model. The shading may be based on, inter alia, the material properties of the items.

An example of virtual lighting for a 3D composite model is virtual light sources that are placed within the 3D composite model. These virtual light sources may be defined with certain properties, which could correspond to the measured properties of real-world light sources, for example. The properties of a light source may include, inter alia, the brightness or intensity of the light source (e.g., in lumens), the color of the light source (e.g., in terms of the red-green-blue (RGB) color model or in terms of color temperature in Kelvin), the location of the light source (e.g., the coordinates of the light source), the directionality of the light source, the spread of the light source, and the type of light source. Examples of different types of light sources include point light sources that emit light in all directions from a single location (e.g., a standalone light bulb), directional light sources that uniformly emit light in one direction (e.g., sunlight), spotlights that produce a cone of light (e.g., a flashlight) and ambient light that produces general illumination with no directionality (e.g., light reflected from multiple surfaces in a room).

Another example of virtual lighting for a 3D composite model is image-based lighting. For example, the virtual lighting may include an environment map that captures various light sources in an environment. The environment map may be placed around the periphery of the 3D composite model, and the light sources captured by the environment map may be projected onto the items represented by the 3D composite model. The environment map may also enable the depiction of reflections (e.g., through reflection mapping) on the items represented by the 3D composite model.

In some implementations, the template data 417 includes templates that vary according to the properties of a product bundle. For example, a particular template could be selected for a product bundle to help improve customer appeal of one or more products in the bundle. In this way, the template may be complementary to, or otherwise related to, one or more products in the product bundle. In some cases, different templates may be implemented based on the type, class, or category of products in a product bundle. For example, the background content used for foodstuffs might differ from the background content used for clothing. Alternatively or additionally, different templates might be implemented for different numbers of items in a product bundle. For example, a product bundle including three items might have a different arrangement than a product bundle including five items. Templates that are specific to a particular number of items in a product bundle and to a specific category of products (e.g., three bottles of sauce) are also possible.

In some implementations, the template data 417 stores templates that are specific to, personalized for, or otherwise associated with certain merchants. For example, an arrangement of items and/or background content in a template may be selected based on merchant preferences. This may help maintain consistency between a 3D composite model generated using the template and other product media utilized by the merchant. A merchant may directly specify that 3D composite models for their product bundles use a particular arrangement of items and/or include certain background content. For example, a template may be transmitted from the merchant device 430 to the product bundling engine 402 for storage in the template data 417. In some cases, the product bundling engine 402 may provide a screen page or other user interface to allow merchants to build their templates. For example, different aspects of templates could be parameterized by the product bundling engine 402 and implemented as a set of options for generating templates. This set of options could be provided to a merchant via the merchant device 430, for example, and allow the merchant to build a template by selecting from the set of options via input at the merchant device 430. Once built, the template may be stored in the template data 417.

Templates stored in the template data 417 may also or instead be based on existing product media implemented by a merchant. In this way, a template that is used in existing product media may be reused in 3D composite models generated by the product bundling engine 402. For example, background content may be extracted from the existing product media. If the existing product media corresponds to a product bundle, then an arrangement of items may also or instead be obtained based on the depicted positions of the products in the product bundle. Consider a case in which a merchant has an existing 3D composite model of a product bundle. Individual 3D models representing the products in the product bundle may be removed to obtain a blank template for the 3D composite model. The blank template could then be stored in the template data 417. In some implementations, the product bundling engine 402, and/or another computing system or device, could deconstruct or decompose existing product media using image analysis algorithms, for example, to obtain a template. Non-limiting examples of image analysis algorithms include edge detection, scale-invariant feature transform (SIFT), thresholding, Hough transform, and the like. The image analysis algorithms may separate depictions of items from background content in the product media to isolate the background content.

Furthermore, in some cases, a template for a 3D composite model might be associated with a customer (e.g., be selected and/or provided by the customer device 440). For example, an environment map may be generated based on measurements of a real-world room of the customer's home and stored in the template data 417. The environment map could be applied to a 3D composite model so that the 3D composite model pertains to the customer.

The 3D composite model generator 418 includes and/or implements one or more algorithms (possibly in the form of software instructions executable by the processor 404) to generate 3D composite models based on pre-existing 3D models. The 3D composite model generator 418 may use one or more pre-existing 3D models corresponding to products in a product bundle to generate the 3D composite model. The 3D composite model generator 418 may also use a template to generate the 3D composite model. For example, the template may include background content and/or a defined arrangement of items. The pre-existing 3D models may be added to the background content at positions defined by the arrangement to create the 3D composite model. In some cases, the 3D models may be obtained from the 3D model data 416 and/or the template may be obtained from the template data 417.

Figure 5:
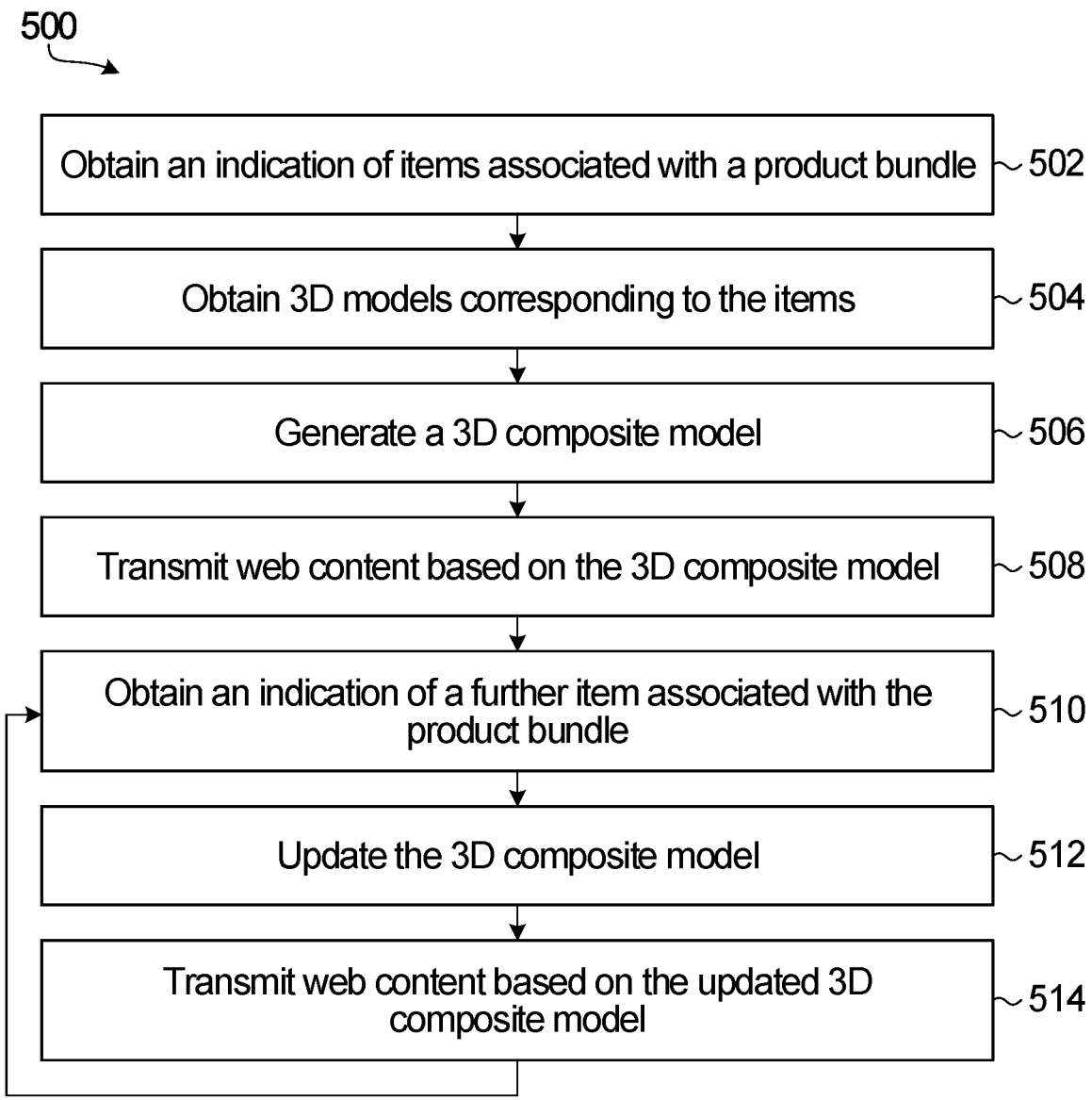
FIG. 5 is a flow diagram illustrating a method for generating product media for a product bundle, according to an embodiment.

An example method will now be described. FIG. 5 is a flow diagram illustrating a method 500 for generating product media for a product bundle, according to an embodiment. The method 500 will be described as being performed, at least in part, by the product bundling engine 402 of FIG. 4. For example, the memory 406 may store instructions which, when executed by the processor 404, cause the processor 404 to perform the method 500. However, other implementations of the method 500 are also contemplated. In general, the method 500 is not limited to a product bundling engine and may instead be performed in whole or in part by a merchant device, a customer device, and/or an e-commerce platform, for example.

Step 502 includes the processor 404 obtaining an indication of two or more items included in, or otherwise associated with, a product bundle. These items may be products that are sold online by a merchant. For example, the items may be offered for sale in the online store 424. However, the product bundle need not be actively sold online. In some cases, the product bundle might be a suggested product bundle that is awaiting merchant approval.

In some implementations, the product bundle is at least partially selected by a user. Step 502 may include receiving, from a user device, an indication selecting at least one of the items associated with the product bundle. This indication may be sent from the user device as an HTTP message or as another form of web content, for example. Optionally, multiple different indications may be received in step 502 that select the items of the product bundle. The user device transmitting the indication could be a merchant device or a customer device, depending on whether the product bundle is merchant-selected or customer-selected. For example, a merchant could use the merchant device 430 to select at least one item for inclusion in the product bundle and/or a customer could use the customer device 440 to select at least one item for inclusion in the product bundle. In some cases, the product bundle might be selected by both a merchant and a customer. For example, a merchant may choose one fixed product for inclusion in the product bundle and allow customers to select another product for the product bundle from a set of possible products.

In some implementations, the product bundle is at least partially selected by the product bundling engine 402 and/or another computing system. For example, the indication of the items associated with the product bundle may be output by the product bundle generator 414. As discussed elsewhere herein, the product bundle generator 414 might use defined conditions and/or ML models to select items for a product bundle. Step 502 may include obtaining customer behavior data pertaining to one or more items and selecting at least one item for the product bundle based on the customer behavior data. For example, at least a portion of the customer behavior data 410 may be analysed by the product bundle generator 414, which might select an item for the product bundle based on the customer behaviour data 410. Alternatively or additionally, step 502 may include obtaining product data pertaining to one or more items and selecting at least one item for the product bundle based on the product data. For example, the product data 412 may be analysed by the product bundle generator 414 and used to select an item for the product bundle.

The items in a product bundle could be selected and/or updated in real-time as customer behaviour data is obtained. In some implementations, step 502 may include obtaining first customer behavior data pertaining to one or more items and selecting a first item for the product bundle based on the first customer behavior data. Selecting the first item may be performed responsive to obtaining the first customer behavior data. Step 502 may further include obtaining second customer behaviour data pertaining to one or more items at a later time and, responsive to obtaining the second customer behaviour data, selecting a second item for the product bundle based on the second customer behaviour data. For example, the second customer behaviour data may relate to new online actions that have been performed by one or more customers in the online store 424 and/or elsewhere. In this way, the product bundle may be created and/or updated in real-time as customer behaviour data is obtained.

In some implementations, the customer behaviour data used to select at least one of the items for the product bundle could be specific to a particular customer, such as the customer associated with the customer device 440, for example. In this way, the product bundle might be personalized for this particular customer. The product bundle might be offered only to the particular customer and not offered to other customers. By way of example, a customer may use the customer device 440 to navigate the online store 424, and customer behaviour data that is specific to the customer may be obtained based on their actions in the online store 424. Non-limiting examples of such actions include orders placed in the online store 424, search criteria entered into the online store 424, and product pages viewed in the online store 424. The customer behaviour data may also relate to other online activity performed by the customer, such as activity performed in other online stores, online marketplaces and/or social media platforms, for example. Furthermore, the customer behaviour data may include known attributes for the customer, including body metrics, skin tone and/or customer preferences, for example. The customer behaviour data that is specific to the customer might be input into the product bundle generator 414 to obtain a personalized product bundle.

Personalized product bundles may be generated and/or updated in real-time as online activity is performed by a particular customer. Consider a case in which a customer is navigating the online store 424 using the customer device 440 and customer behaviour data is obtained in real-time based on the customer's actions in the online store 424. A first instance of customer behaviour data for the customer may relate to a first product, and a second instance of customer behaviour data for the customer may relate to a second product. For example, the first instance of customer behaviour data may include a record of the customer viewing a product page for the first product, and the second instance of customer behaviour data may include a record of the customer adding the second product to their shopping cart. The first and second instances of customer behaviour data may be input into the product bundle generator 414, which may determine that the first and second products meet the conditions for forming a product bundle. This product bundle might be offered to the customer while they navigate the online store 424 to incentivise the purchase of the first product in addition to the second product.

Step 504 includes the processor 404 obtaining two or more 3D models corresponding to the items associated with the product bundle. In some implementations, a respective 3D model might be obtained for each of the items associated with the product bundle; however, this need not always be the case. A single 3D model could correspond to two or more of the items associated with the product bundle. For example, this 3D model could represent a different, pre-existing product bundle.

In some implementations, the 3D models may be obtained from the 3D model data 416. Alternatively or additionally, the 3D models may be obtained from another system or device. For example, in the case that the product bundle is merchant-selected, the merchant device 430 may transmit the 3D models corresponding to the items to the product bundling engine 402. The 3D models obtained in step 504 may be pre-existing 3D models that are in use by a merchant to present products to customers. For example, the 3D models may be implemented in screen pages of the online store 424.

Step 506 includes the processor 404 generating a 3D composite model corresponding to the product bundle. Step 506 may be performed based on the 3D models obtained in step 504. For example, the generated 3D composite model may include representations of the items in the product bundle that are based on the 3D models. Each of the 3D models may be placed at a respective location within a single virtual space to form a virtual scene that depicts the product bundle. In this way, the method 500 may leverage pre-existing 3D models to generate the 3D composite model of the product bundle, which may avoid the use of expensive 3D scans and/or graphical designing for the product bundle. Step 508 may be performed using the 3D composite model generator 518.

The 3D composite model may be generated based on a template, which may include an arrangement of the items in the product bundle and/or background content for the items. Generating the 3D composite model based on the template may include combining the 3D models corresponding to the items with the background content in the 3D composite model. Alternatively or additionally, generating the 3D composite model based on the template may include placing the 3D models corresponding to the items relative to each other in the 3D composite model based on the defined item arrangement.

Step 506 may include obtaining the template used to generate the 3D composite model from the template data 417. Alternatively or additionally, step 506 may include receiving the template from another computing system or device, such as the merchant device 430 and/or the online store 422, for example. In some implementations, the template is associated with at least one of the items in the product bundle. For example, step 506 may include selecting the template based on the properties of the product bundle, such as the number of items in the product bundle and/or the type, class, or category of items in the product bundle. These properties of the product bundle may be used to filter the templates in the template data 417 and select a particular template for the product bundle. Alternatively or additionally, step 506 may include obtaining the template based on a software instance that sells at least one of the items in the product bundle online. For example, the templates in the template data 417 may be filtered based on the software instance to obtain a particular template that pertains to one or more of the items in the product bundle. An example of such a software instance is the online store 424. A template that is specific to online store 424 and/or to a merchant of the online store 424 may be obtained in step 506. This may be a template that was previously provided and/or generated by the merchant, for example.

In some implementations, step 506 may include generating the template used in the 3D composite model based on existing product media. For example, background content may be extracted from, or otherwise determined based on, one or more of the 3D models obtained in step 504. In addition to including a representation of an item in the product bundle, a 3D model obtained in step 504 may also include other content (e.g., images, 3D surfaces, environment maps and/or audio content) that is separate from the item. This other content may be extracted from the 3D model and implemented as background content for the 3D composite model. Alternatively or additionally, at least a portion of a template may be extracted from related product media that is different from the 3D models obtained in step 504. This related product media may include product media representing the items in the product bundle (e.g., images and/or videos of the items that are different from the 3D models obtained in step 504) and/or product media depicting other product bundles sold by a merchant. The related product media may be obtained from the same software instance that sells at least one item in the product bundle (e.g., from the online store 424). Image analysis algorithms may be used to extract the background content from related product media. In the case that the related product media is for a product bundle, an arrangement of items may also be extracted using the image analysis algorithms.

The background content obtained in step 506 may include virtual lighting for the 3D composite model. This virtual lighting may provide object-oriented lighting and/or global illumination for the 3D composite model. Possible lighting models that may be used for simulating lighting in the 3D composite model include the Lambert model, the Phong illumination model, the Blinn-Phong illumination model, radiosity, ray tracing, beam tracing, cone tracing, path tracing, volumetric path tracing, Metropolis light transport, ambient occlusion, photon mapping, signed distance field and image-based lighting, for example. Virtual lighting may be added to the 3D composite model to simulate illumination of the items in the product bundle under consistent lighting conditions. For example, the 3D composite model may simulate the items in the product bundle being lit by a single set of light sources, which may provide a more cohesive representation of the items. In contrast, if each of the items were lit according to different lighting conditions (e.g., the lighting conditions used in the different 3D models obtained in step 504), then the overall lighting depicted in the 3D composite model may appear inconsistent and/or unrealistic.

The virtual lighting for the 3D composite model may be obtained and/or defined in the form of an environment map. If one of the 3D models obtained in step 504 includes an environment map, then this environment map may be extracted from the 3D model. Alternatively or additionally, an environment map may be generated by performing image analysis on product media (e.g., on a 3D model of an item and/or on related product media). Background content depicted in the product media may be extracted and stitched together to form an environment map. Further, light interactions shown on the surfaces of items in the product media and knowledge of the item's material properties may be used to help determine at least a portion of the environment map (e.g., locate blobs of light and/or dark areas in the environment based on light interactions on the item). Once an environment map is generated or otherwise obtained, the environment map may be added to the 3D composite model to provide, inter alia, virtual lighting in the 3D composite model.

Alternatively or additionally, the virtual lighting for the 3D composite model may be obtained and/or defined in the form of properties of one or more light sources. The properties of a light source may be extracted from one or more of the 3D models obtained in step 504. For example, light sources may be defined as distinct objects in the 3D models that are separable from representations of items. Alternatively or additionally, the light interactions depicted on an item in product media may be analyzed to determine the light sources that may have produced those interactions. If the materials of the item are known, then the corresponding material properties may be used to help characterize the light sources. For example, the light interactions may be extracted from the product media through image analysis and be compared to the material properties to determine which light sources may have produced those light interactions. Once the properties of the light sources are determined, virtual light sources may be added to the 3D composite model based on those properties.

In some implementations, background content that is extracted from multiple instances of product media (e.g., two or more of the 3D models obtained in step 504) may be averaged to obtain a single set of background content for the 3D composite model. For example, the lighting depicted in multiple instances of product media may be extracted and averaged to obtain a single set of lighting conditions for the 3D composite model.

After the 3D composite model is generated in step 506, it may be implemented as product media for the product bundle. Step 508 is an optional step that includes the processor 404 and/or the computing system 422 transmitting web content that is based on the 3D composite model. The web content may include the full 3D composite model and/or include 2D product media that is generated based on the 3D composite model. This 2D product media may include images and/or videos that are based on renderings of the 3D composite model. Optionally, the web content is transmitted for display on a user device, such as the merchant device 430 and/or the customer device 440, for example. In some implementations, this may be the same user device that selected one or more of the items for the product bundle in step 502. For example, a customer or merchant may have selected the items for the product bundle, and the web content may present the selected product bundle to the customer or merchant. Alternatively or additionally, the product bundle may have been suggested by the product bundle generator 414, and the web content may be transmitted to the merchant device 430 to help a merchant review and/or approve the suggested product bundle. Alternatively or additionally, the product bundle may have been suggested based on customer behaviour data that is specific to a particular customer in step 502, and the web content may be transmitted to the customer device 440 that is associated with this customer. For example, the product bundle may have been suggested based on the customer's actions as they browse the online store 424. The 3D composite model might then be presented to the customer via a screen page of the online store 424.

In some implementations, step 508 includes generating 2D content based on the 3D composite model (e.g., a 2D image or video depicting the items in the product bundle) and receiving, from a user device, a request for web content associated with the product bundle. Responsive to this request, web content including the 2D content may be transmitted to the user device. Consider, by way of example, a case in which this user device is the customer device 440 that is browsing the online store 424. The processor 404 may generate 2D content based on the 3D composite model and transmit the 2D content to the computing system 422 for implementation in the online store 424. For example, the 2D content may depict one or more views of the product bundle. The 2D content may also depict the background content in the 3D composite model, to help improve the customer appeal of the product bundle. The computing system 422 might receive, from the customer device 440, a request for web content associated with the product bundle. For example, the customer device 440 may request a product page of the online store 424 corresponding to the product bundle. The computing system 422 may then transmit the web content to the customer device 440 responsive to the request, where the web content includes the 2D content for the product bundle. In this way, the web content may present the product bundle to the customer. The 2D content for the product bundle could avoid a situation in which multiple different instances of product media are transmitted to the customer device 440, where each of the different instances depicts a different item in the product bundle. This may reduce the amount of data that is transmitted over the network 420 while the customer browses the online store 424.

It should be noted that step 508 may include streaming interactive video and/or non-interactive video that is based on the 3D composite model. The interactive video, which may be implemented using "cloud rendering", could be displayed in a 3D model viewer that responds to user input and then streams updated video based on user input. On the other hand, the non-interactive video may include fixed renders of the 3D composite model that might not be controllable by a user.

In some implementations, the 3D composite model of the product bundle may be implemented within an augmented reality (AR), mixed reality (MR) or extended reality (XR) experience at the customer device 440. Consider a product bundle that includes multiple items of furniture. A 3D composite model of the product bundle may include 3D representations of each of the products that may be mapped to a real-world environment in an AR experience on the customer device 440. For example, the 3D composite model may be mapped to a room of a customer's home. The 3D representations of the products may be individually movable within the AR experience to allow the customer to arrange the products within their home.

The method 500 may be implemented as a real-time process that includes recognizing that product media for a product bundle is needed, generating the 3D composite model in response to that need, using the 3D composite model to create the product media for the product bundle, and/or transmitting the product media for display on a user device. Accordingly, any, one, some or all of steps 504, 506, 508 may be performed automatically in response to obtaining an indication of the items associated with the product bundle in step 502. In this way, the method 500 may reduce delays between obtaining a new product bundle and obtaining product media for the product bundle. By way of example, steps 504, 506, 508 may be performed automatically in response to receiving, from a user device, an indication selecting at least one of the items. This may provide real-time generation of the 3D composite model and/or other product media as items are selected for the product bundle. Alternatively or additionally, steps 504, 506, 508 may be performed automatically in response to receiving an indication suggesting a new product bundle. This indication may be received from the product bundle generator 414, for example.

In some implementations of the method 500, the product bundle and/or the 3D composite model are updated over time. For example, new items may be added to the product bundle, and the 3D composite model may be modified to include representations of those new items. An item may also or instead be removed from the product bundle, which could result in the 3D composite model being updated to remove the representation of that item. Optional steps 510, 512, 514 may be performed in these implementations.

Step 510 includes the processor 404 obtaining an indication of a further item associated with the product bundle. The product bundle may then be updated to include the further item. In some implementations, step 510 includes receiving an indication selecting the further item from a user device. This user device may be the merchant device 430 or the customer device 440, for example. Optionally, the indication may be provided by the same user and/or user device that provided an indication selecting an item in step 502. For example, a merchant or a customer may be actively selecting items for the product bundle using the merchant device 430 or the customer device 440. Steps 502, 510 might relate to different instances of user input at the merchant device 430 or the customer device 440 selecting items for the product bundle.

Alternatively or additionally, step 510 may include receiving a suggestion from the product bundle generator 414 and/or from another computing system to add the further item to the product bundle. The suggestion to add the further item to the product bundle may be generated in response to new customer behaviour data being obtained by the product bundling engine 402. This is an example of the product bundle being updated in real-time as one or more customers navigate the online store 424 and/or perform other actions online.

Step 512 includes the processor 404 updating the 3D composite model generated in step 506 to include a representation of the further item added to the product bundle. An updated 3D composite model may be obtained following step 512, which includes representations of the items indicated in step 502 and a representation of the further item indicated in step 510. In some implementations, step 512 is performed responsive to obtaining the indication of the further item in step 510 to update the 3D composite model in real-time.

Step 514 includes the processor 404 and/or the computing system 422 transmitting web content based on the updated 3D composite model, optionally to a user device for display on that device. For example, the web content may be transmitted for display on the merchant device 430 and/or the customer device 440. The web content may include the updated 3D composite model and/or include 2D content that is generated based on the updated 3D composite model. In some implementations, the web content is transmitted to the user device that selected the further item for the product bundle in step 510, which may allow the user to view the updated product bundle during the selection process.

As illustrated using an arrow from step 514 to step 510 in FIG. 5, steps 510, 512, 514 may be performed multiple times to repeatedly and/or continuously update the product bundle and the 3D composite model, and transmit new web content based on the updated 3D composite model. In some cases, steps 512, 514 might be performed rapidly by the processor 404 to reduce the delay between user selection of an item for the product bundle and obtaining updated product media for the product bundle.

Further Examples

Figure 6:
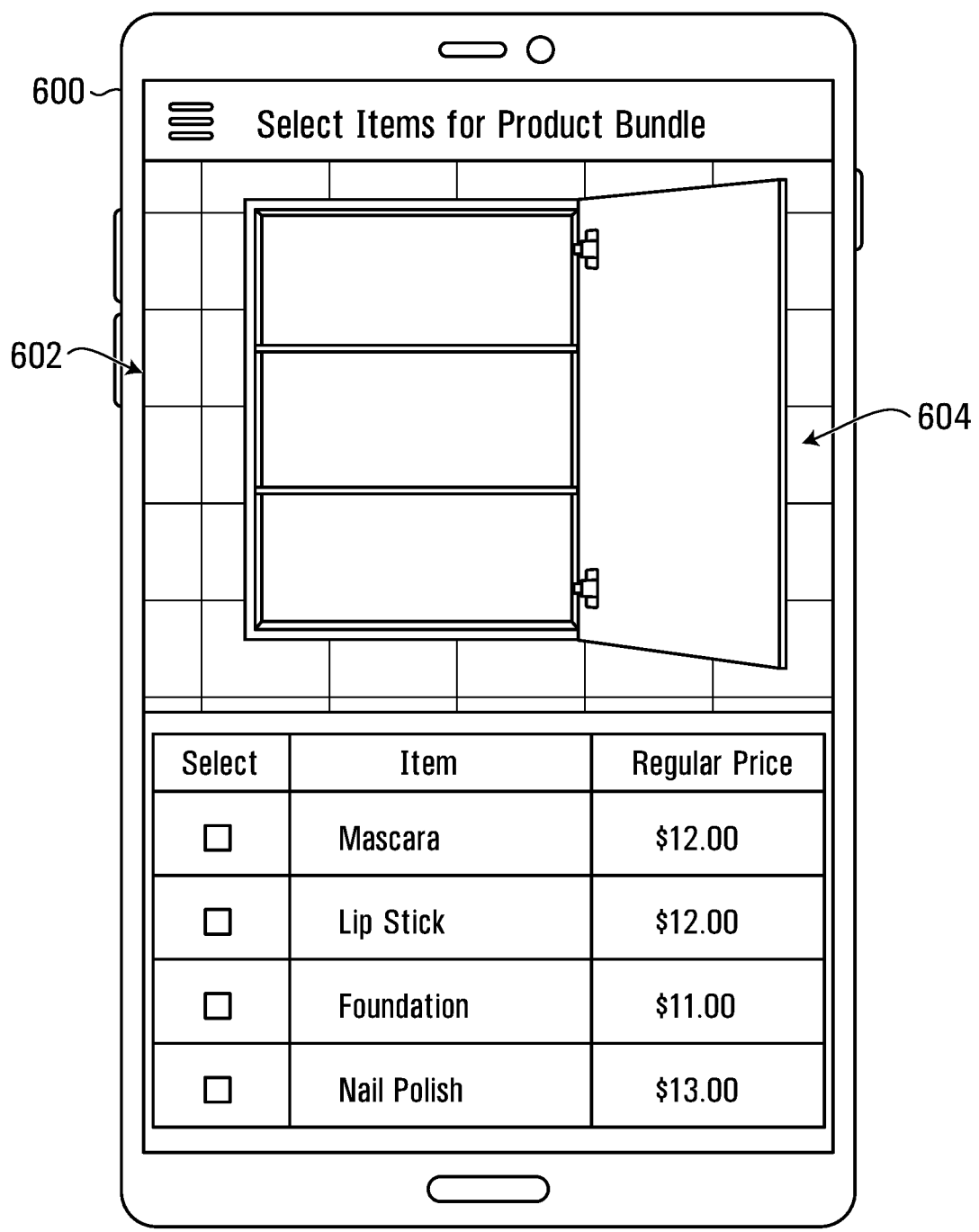
FIG. 6 illustrates a user device displaying a screen page that enables a user to select items for a product bundle, according to an embodiment.

FIGS. 6 to 9 show an example implementation of the method 500. FIG. 6 illustrates a user device 600 displaying a screen page 602 that enables a user to select products for a product bundle, according to the embodiment. As shown, no products have yet been selected for the product bundle in the screen page 602. The screen page 602 includes product media 604 depicting a 3D representation of a bathroom cabinet. This representation of the bathroom cabinet provides a virtual environment or setting in which 3D models of selected products may be added to form a 3D composite model of the product bundle. In this way, the product media 604 may be considered a render of background content for the 3D composite model. The background content may include a 3D model of the bathroom cabinet and/or virtual lighting, for example.

A merchant or a customer may use the screen page 602 to build the product bundle. For example, the user device 600 may be a merchant device or a customer device. In the case that a merchant is selecting the product bundle, the screen page 602 may be accessed through an administrator of an e-commerce platform (e.g., through the administrator 114 of FIG. 1), for example. The screen page 602 might allow the merchant to create new product bundles for sale in their online store while simultaneously viewing corresponding product media that depicts the product bundle. Alternatively, in the case that a customer is selecting the product bundle, the screen page 602 may correspond to a product page of an online store. The online store may include an offer for the customer to select three products for the product bundle out of a set of four possible products. The product bundle may be offered for a discounted price (e.g., the product bundle may be sold for the fixed price of $30). Product media depicting the customer's selected product bundle may be generated in real-time as the customer selects products.

Figure 7:
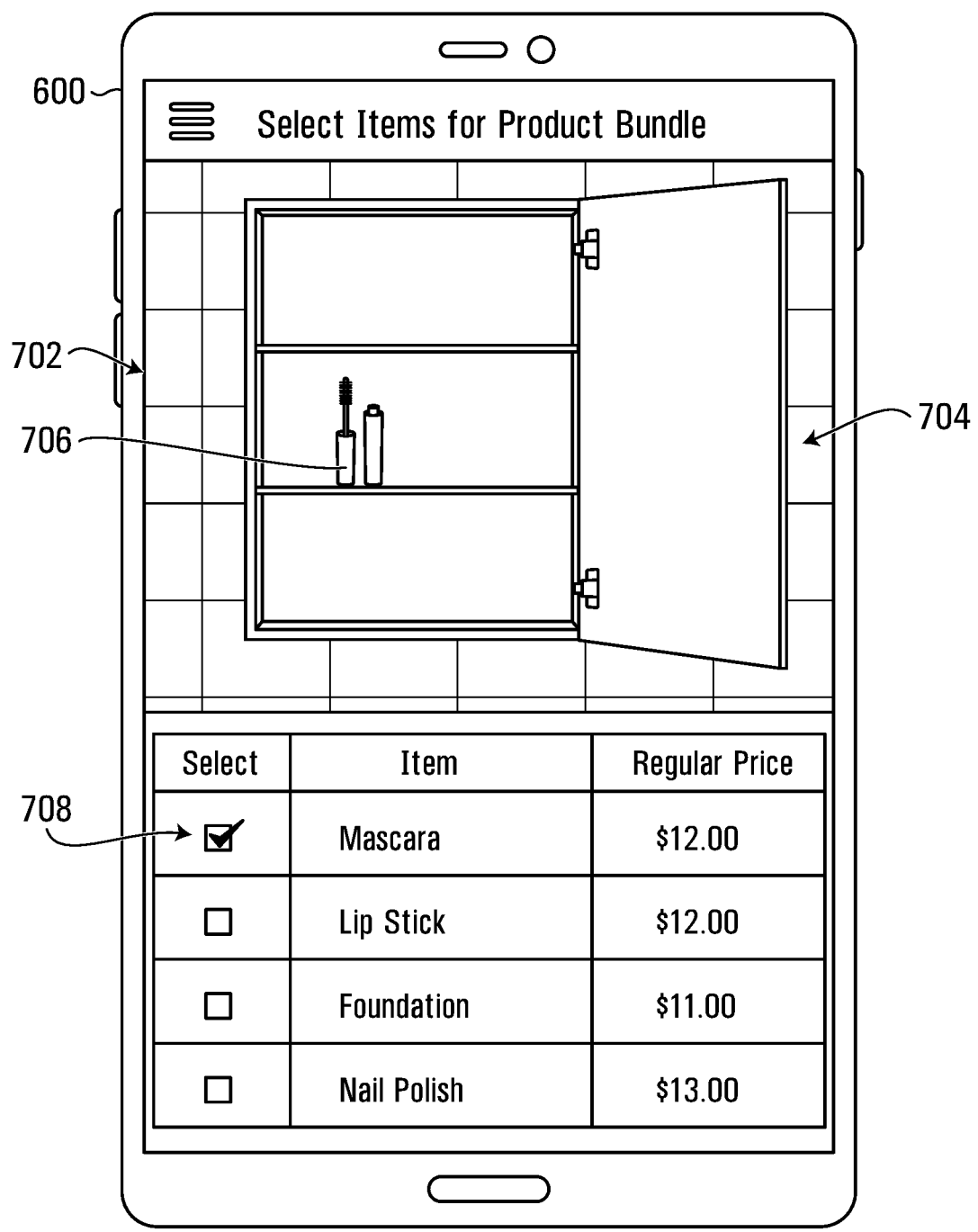
FIG. 7 illustrates the user device of FIG. 6 displaying another screen page in which a first product has been selected for the product bundle by the user.
Figure 8:
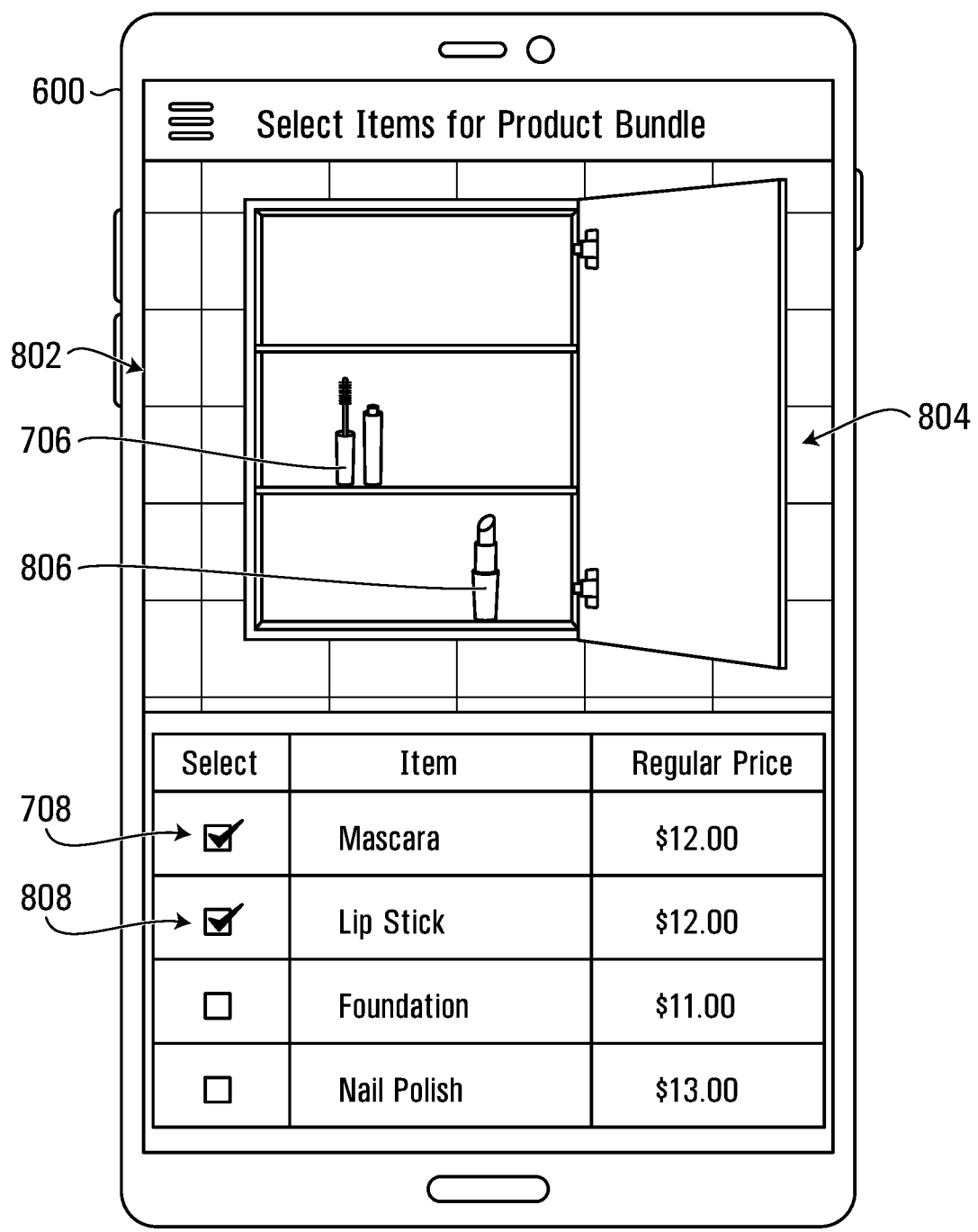
FIG. 8 illustrates the user device of FIG. 6 displaying a further screen page in which a second product has been selected for the product bundle by the user.

FIG. 7 illustrates the user device 600 displaying another screen page 702 including an indication 708 that a first product has been selected for the product bundle by the user. The screen page 702 also includes updated product media 704 that includes the background content depicting the bathroom cabinet and further includes a representation 706 of the first product. FIG. 8 illustrates the user device 600 displaying a further screen page 802 including an indication 808 that a second product has been selected for the product bundle by the user. The screen page 802 includes another instance of product media 804, which is similar to the product media 704 but additionally includes a representation 806 of the second product.

The screen page 702 may have been generated in response to user input at the user device 600 selecting the first product. Similarly, the screen page 802 may have been generated in response to further user input selecting the second product. For example, the user may have tapped on a touch screen of the user device 600 to select the first product and then tapped again to select the second product. An HTTP message or other form of web content may have been transmitted by the user device 600 based on each instance of user input. These HTTP messages could have been sent to a computing system implementing the method 500 (e.g., sent to the product bundling engine 402 of FIG. 4). For example, the HTTP messages could be considered indications selecting the first and second products, which are received by the computing system in step 502 of the method 500. In step 504 of the method 500, the computing system may obtain 3D models that correspond to the first and second products. Next, in step 506 of the method 500, the computing system may generate a 3D composite model that includes representations of the first and second products based on the obtained 3D models. The screen page 802 provides an example of web content that may be generated based on the 3D composite model and transmitted to the user device 600 from the computing system in step 508 of the method 500. The screen page 802 may implement the full 3D composite model, in which case the product media 804 could be a render of the 3D composite model generated by the user device 600. The user may manipulate (e.g., move or rotate) the viewpoint of the 3D composite model using the user device 600. Alternatively, the product media 804 may be a render of the 3D composite model generated by the computing system. In some implementations, steps 504, 506, 508 may be performed automatically in response to receiving the HTTP message indicating the user selection of the second product. Further, steps 504, 506, 508 may be performed rapidly by the computing system to reduce the latency between receiving the indication selecting the second product and generating the screen page 802.

The 3D composite model may have been generated by placing the 3D models of the first and second products within the background content depicting the bathroom cabinet, as shown in the product media 804. The first and second products relate to cosmetics, so this background content may provide a complementary setting for the product bundle. The background content may form part of a template for the 3D composite model. The first and second products are arranged on different shelves of the bathroom cabinet in the 3D composite model, which correspond to a defined item arrangement in the template. For example, the relative locations of the 3D models corresponding to the first and second products may be defined by the template. Further, the template for the 3D composite model may include virtual lighting. The representations 706, 806 of the first and second products might both be generated based on this virtual lighting in order to provide cohesive lighting conditions for the first and second products. The virtual lighting may simulate the typical lighting of a bathroom in order to further increase the realism of the 3D composite model.

Figure 9:
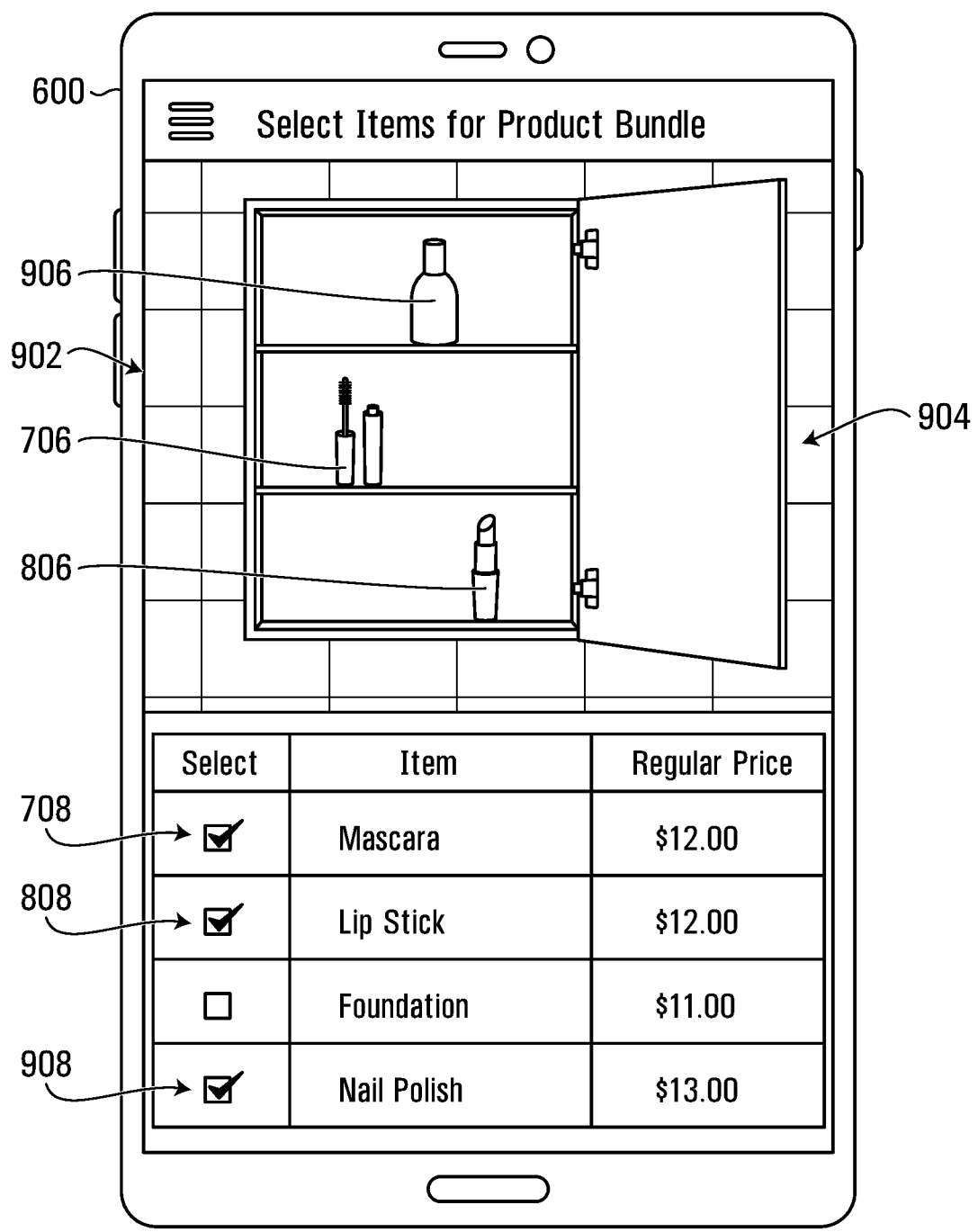
FIG. 9 illustrates the user device of FIG. 6 displaying yet another screen page in which a third product has been selected for the product bundle by the user.

FIG. 9 illustrates the user device 600 displaying yet another screen page 902 including an indication 908 that a third product has been selected for the product bundle by the user. The screen page 902 also includes updated product media 904. The product media 904 is similar to the product media 804, but further includes a representation 906 of the third product. The screen page 902 provides an example of web content that may be transmitted to the user device 600 by the computing system in step 514 of the method 500. For example, the user may have selected the third product for inclusion in the product bundle, which may have resulted in the transmission of an HTTP message to the computing system indicating this selection. The HTTP message may be received by the computing system in step 510 of the method 500. In response to the HTTP message, the computing system may perform step 512 to update the 3D composite model to include a representation of the third product. For example, a 3D model of the third product could be obtained by the computing system and added to the existing 3D composite model according to the template. This may result in the generation of an updated 3D composite model, which could be used to create the product media 904. The product media 904 allows the user to view and/or interact with the updated product bundle including the third product.

Advantageously, the automatic generation and updating of the 3D composite model illustrated in FIGS. 6 to 9 may provide the user device 600 with dedicated product media for the product bundle being selected by the user. This product media may be provided to the user device 600 in real-time as the product bundle is selected. As a result, 3D composite models corresponding to each possible variation of the product bundle might not need to be pre-generated and stored by the computing system to provide product media in real-time, which may conserve computer storage resources. Further, the screen page 902 only includes the one instance of product media 904, rather than multiple instances of product media corresponding to the first, second and third products, which may reduce the bandwidth associated with transmitting the screen page 902 to the user device 600.

Figure 10:
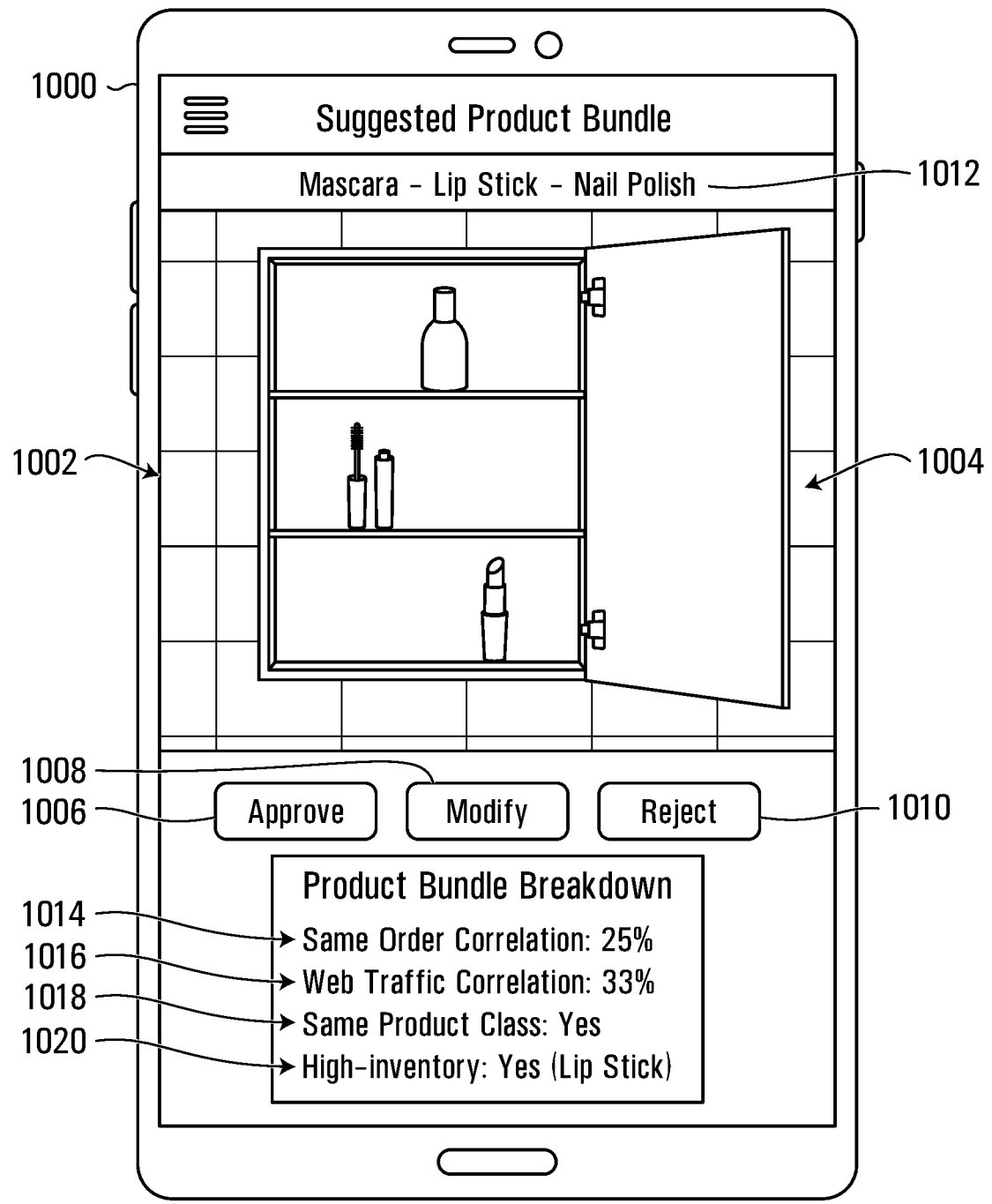
FIG. 10 illustrates a merchant device displaying a screen page that provides a suggested product bundle, according to an embodiment.

FIG. 10 shows another example implementation of the method 500. FIG. 10 illustrates a merchant device 1000 displaying a screen page 1002 that provides a suggested product bundle, according to an embodiment. The merchant device 1000 may be used by a merchant of an online store, and the screen page 1002 may recommend the product bundle for sale in that online store. The screen page 1002 includes an indication 1012 of the three products in the product bundle and product media 1004 that depicts the product bundle. The screen page 1002 further includes an option 1006 for the merchant to approve the product bundle for sale in their online store, an option 1008 to modify the product bundle, and an option 1010 to reject the product bundle.

The product media 1004 generally corresponds to product media 904 of FIG. 9, but is generated in response to a system recommending the product bundle rather than user selection of the product bundle. The product bundle may have been suggested based on customer behaviour data and/or product data pertaining to the products sold through the merchant's online store. The screen page 1002 provides a breakdown of the data used to determine the products for the product bundle, including an indication 1014 of a measured correlation between the products in previous customer orders (expressed as the probability that a previous order for one product in the bundle included another product in the bundle), an indication 1016 of a measured correlation between the products in previous web traffic (expressed as the probability that a customer who viewed the product page of one product in the bundle also viewed the product page of another product in the bundle over a defined time period), an indication 1018 that the products belong to the same class (e.g., the products belong to the merchant's cosmetics collection), and an indication 1020 that the merchant has a high inventory of one of the products (e.g., the inventory of one product may exceed a defined threshold). The indications 1014, 1016, 1018, 1020 may outline how the three products indicated at 1012 meet one or more defined conditions for a suggested product bundle.

The product media 1004 is based on a 3D composite model generated for the suggested product bundle. In some implementations, this 3D composite model may have been generated using the method 500. For example, a computing system may have obtained an indication of the suggested product bundle in step 502 of the method 500. Multiple 3D models corresponding to the products may have then been obtained in step 504 and added to a template to generate the 3D composite model in step 506. As illustrated, this template includes background content depicting a bathroom cabinet. The screen page 1002 is an example of web content that may be generated based on the 3D composite model and transmitted to the merchant device 1000 in step 508 of the method 500. The merchant of the merchant device 1000 may use the product media 1004 to help determine if the suggested product bundle should be offered in their online store.

Figure 11:
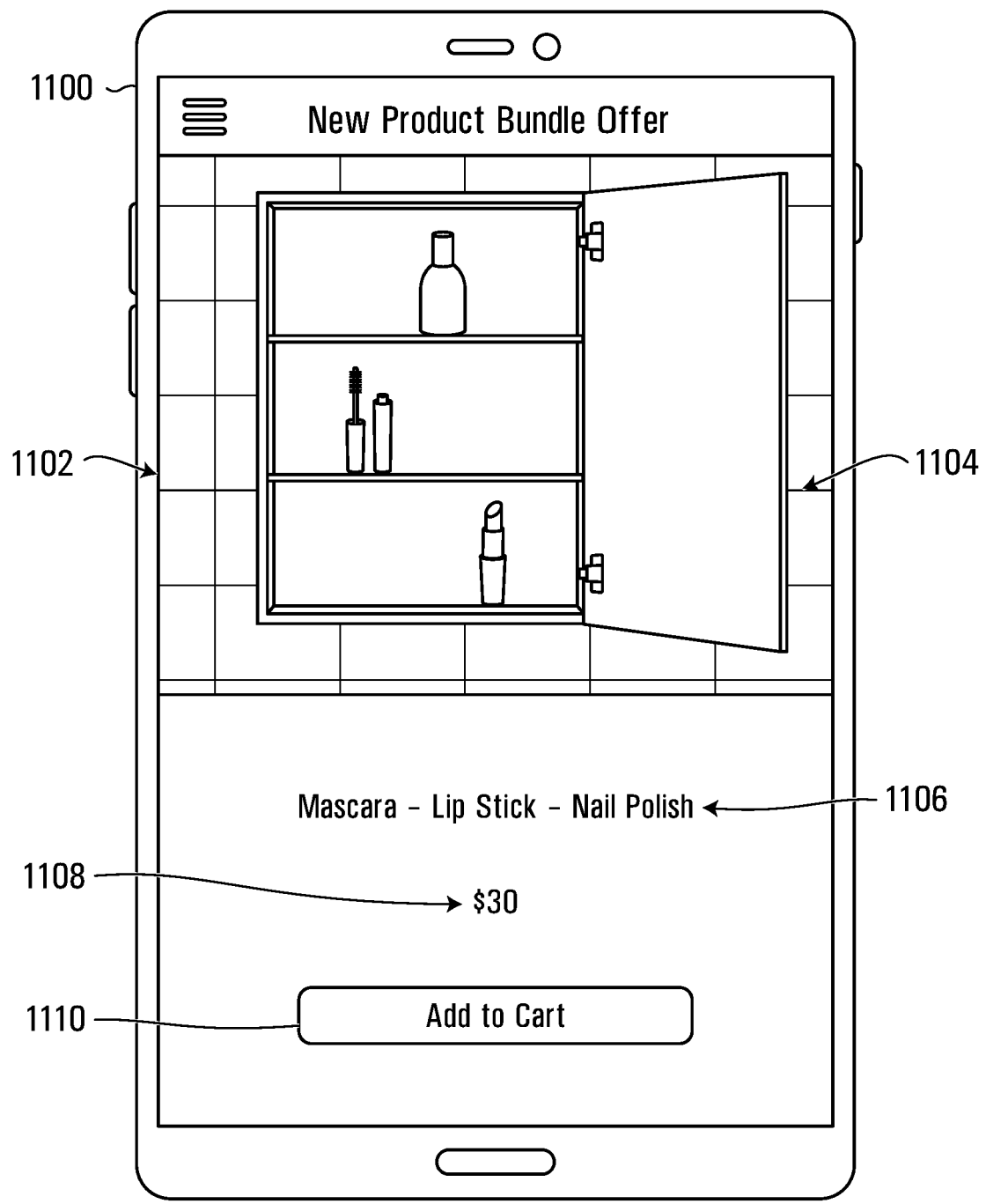
FIG. 11 illustrates a customer device displaying a screen page of an online store, according to an embodiment.

FIG. 11 shows a further example implementation of the method 500. FIG. 11 illustrates a customer device 1100 displaying a screen page 1102 of an online store. The screen page 1102 offers a product bundle for sale to the customer of the customer device 1100. The screen page 1102 includes product media 1104 depicting the product bundle, an indication 1106 of the products included in the product bundle, an indication 1108 of the cost of the product bundle, and an option 1110 to purchase the product bundle.

The product bundle indicated at 1106 is the same product bundle selected in the screen page 902 of FIG. 9 and suggested in the screen page 1002 of FIG. 10. The product media 1104 also generally corresponds to the product media 904, 1004 of FIGS. 9 and 10. As such, the screen page 1102 may correspond to a product page for the product bundle selected in the screen page 902 or may correspond to a product page for the product bundle suggested in the screen page 1002. In some implementations, the product bundle indicated at 1012 may have been specifically suggested for the customer of the customer device 1100. By way of example, the indications 1014, 1016 in the screen page 1002 may be based on customer behaviour data that is specific to the customer of the customer device 1100. The customer may have previously visited the product pages for the products indicated at 1106 and may have previously purchased those products. The product bundle may also have been determined in real-time as the customer navigated the online store. For example, the customer may have recently visited the product pages for any, one, some or all of the products indicated at 1106. The product bundle and the product media 1104 may then have been generated based on these actions by the customer and presented to the customer while they continue to navigate the online store.

Product Packaging

In some embodiments, the systems and methods described herein may be implemented to help improve order fulfillment and packaging. Many merchants using an e-commerce platform may have fulfillment carried out by a fulfillment partner. The fulfillment partner may handle pick-and-pack functions, where they warehouse products for the merchant (and likely other merchants) and retrieve, package, and ship products based on orders from the e-commerce platform. In many cases, the fulfillment partner selects a shipping carton or package from the ones that it has available that are suitable for containing and shipping the ordered product or products.

In some situations, a merchant may provide a product bundle as a single package of products. A merchant may create this product bundle outside of an e-commerce platform and fulfillment system by picking, packaging, and labelling the product bundle on its own. They may then provide the product bundle to the fulfillment partner as a unitary "product". However, this lacks the flexibility to generate and update product bundles with different products, as described elsewhere herein. It may be preferable to have the fulfillment partner package product bundles from the available products. In many cases, the merchant is unaware of the packaging options available to the fulfillment partner and their benefits or drawbacks, such as size, weight, shipping cost, but the merchant may still need to have decision-making control over the final packaged product bundle. Accordingly, creation of a product bundle may involve a series of coordinated communications between at least a merchant and a fulfillment partner, and potentially also an e-commerce platform representative or a third-party app developer. The process may be lengthy and time-consuming to ensure that the packaged product bundle produced by a fulfillment partner meets merchant expectations.

It would be advantageous to improve the generation of product bundles, particularly using the e-commerce platform in a manner that streamlines the process to reduce the time involved, the number of exchanged communications, and/or the possibility of errors. In some embodiments, a 3D composite model of a product bundle generated using the systems and methods disclosed herein may be implemented as a product packaging model. The product packaging model is a computer-generated representation of the packaged product bundle, including the packaging and the products in the bundle. The product packaging model may further include packaging material, such as fill. The product packaging model may be shared between a merchant and a fulfillment partner to better convey the concept and expectations of the merchant to a fulfillment partner.

Further details regarding product packaging models are provided in U.S. patent application Ser. No. 16/724,610, filed Dec. 23, 2019, and U.S. patent application Ser. No. 16/724,658, filed Dec. 23, 2019, the entire contents of which are incorporated herein by reference in their entirety.

Conclusion

Although the present invention has been described with reference to specific features and embodiments thereof, various modifications and combinations can be made thereto without departing from the invention. The description and drawings are, accordingly, to be regarded simply as an illustration of some embodiments of the invention as defined by the appended claims, and are contemplated to cover any and all modifications, variations, combinations or equivalents that fall within the scope of the present invention. Therefore, although the present invention and its advantages have been described in detail, various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Moreover, any module, component, or device exemplified herein that executes instructions may include or otherwise have access to a non-transitory computer/processor readable storage medium or media for storage of information, such as computer/processor readable instructions, data structures, program modules, and/or other data. A non-exhaustive list of examples of non-transitory computer/processor readable storage media includes magnetic cassettes, magnetic tape, magnetic disk storage or other magnetic storage devices, optical disks such as compact disc read-only memory (CD-ROM), digital video discs or digital versatile disc (DVDs), Blu-ray Disc™, or other optical storage, volatile and non-volatile, removable and non-removable media implemented in any method or technology, random-access memory (RAM), read-only memory (ROM), electrically erasable programmable read-only memory (EEPROM), flash memory or other memory technology. Any such non-transitory computer/processor storage media may be part of a device or accessible or connectable thereto. Any application or module herein described may be implemented using computer/processor readable/executable instructions that may be stored or otherwise held by such non-transitory computer/processor readable storage media.

Note that the expression "at least one of A or B", as used herein, is interchangeable with the expression "A and/or B". It refers to a list in which you may select A or B or both A and B. Similarly, "at least one of A, B, or C", as used herein, is interchangeable with "A and/or B and/or C" or "A, B, and/or C". It refers to a list in which you may select: A or B or C, or both A and B, or both A and C, or both B and C, or all of A, B and C. The same principle applies for longer lists having a same format.

The invention claimed is:

1. A computer-implemented method comprising:
obtaining, by at least one computing device, an indication of items associated with a product bundle, wherein obtaining the indication of the items comprises receiving a first indication selecting at least one of the items, the at least one of the items associated with a software instance;
obtaining, by the at least one computing device, a three-dimensional (3D) model template based on both a number of the items associated with the product bundle and at least one of a product type, class, or category of the items associated with the product bundle, the 3D model template defining, for each item of the items associated with the product bundle, a respective location and a respective orientation for a 3D model corresponding to the item, wherein the 3D model template is further obtained by filtering template data based on the software instance;
obtaining, by the at least one computing device, pre-existing 3D models corresponding to the items associated with the product bundle; responsive to receiving the first indication indicating the selection of the at least one of the items:
generating, by the at least one computing device, a 3D composite model based on the 3D model template including placing each pre-existing 3D model at a respective location and orientation according to the 3D model template so that the pre-existing 3D models are arranged and oriented relative to one another in the 3D composite model, the 3D composite model comprising representations of the items associated with the product bundle based on the pre-existing 3D models corresponding to the items; and
causing rendering, by the at least one computing device, the generated 3D composite model within a page of the software instance as a singular instance of product media.

2. The method of claim 1, wherein:
the 3D model template further includes background content; and
generating the 3D composite model based on the 3D model template further comprises combining the pre-existing 3D models corresponding to the items with the background content in the 3D composite model.

3. The method of claim 2, wherein the background content comprises virtual lighting.

4. The method of claim 1, wherein
at least one of the items is sold online by the software instance; and
the at least one of the items is associated with the 3D model template.

5. The method of claim 1, further comprising:
receiving, from a user device, a second indication selecting a further item; and
responsive to receiving the second indication selecting the further item, updating the 3D composite model to obtain an updated 3D composite model, the updated 3D composite model comprising the representations of the items and a representation of the further item.

6. The method of claim 1, wherein the items include a first item, and obtaining the indication of the items comprises:
obtaining first data regarding customer behavior pertaining to the items; and
selecting the first item for the product bundle based on the first data.

7. The method of claim 6, wherein the first data is specific to a particular customer, the method further comprising:
transmitting, to a user device associated with the particular customer, web content based on the 3D composite model for display on the user device.

8. The method of claim 6, wherein selecting the first item for the product bundle is performed responsive to obtaining the first data, the items further include a second item, and obtaining the indication of the items further comprises:
obtaining second data regarding customer behavior pertaining to the items; and
responsive to obtaining the second data, selecting the second item for the product bundle based on the second data.

9. The method of claim 1, further comprising:
receiving, from a user device, a request for web content associated with the product bundle, the web content including a product page of an online store providing the 3D composite model; and
transmitting the web content to the user device responsive to the request.

10. The method of claim 1, wherein placing each pre-existing 3D model at the respective location and orientation comprises assigning each pre-existing 3D model a respective coordinate and/or vector defined within a virtual coordinate system of the 3D composite model.

11. The method of claim 1, wherein the 3D model template further includes background content, and wherein each pre-existing 3D model is placed at the respective location and orientation according to the 3D model template so that the pre-existing 3D models are arranged and oriented relative to the background content.

12. A system comprising:
memory to store pre-existing three-dimensional (3D) models corresponding to items; and
at least one processor to:
obtain an indication of items associated with a product bundle, wherein the indication includes a first indication selecting at least one of the items, the at least one of the items associated with a software instance;
obtain a 3D model template based on both a number of the items associated with the product bundle and at least one of a product type, class, or category of the items associated with the product bundle, the 3D model template defining, for each item of the items associated with the product bundle, a respective location and a respective orientation for a 3D model corresponding to the item, wherein the 3D model template is further obtained by filtering template data based on the software instance;
obtain pre-existing 3D models corresponding to the items associated with the product bundle;
responsive to receiving the first indication indicating the selection of the at least one of the items:
generate a 3D composite model based on the 3D model template including placing each pre-existing 3D model at a respective location and orientation according to the 3D model template so that the pre-existing 3D models are arranged and oriented relative to one another in the 3D composite model, the 3D composite model comprising representations of the items associated with the product bundle based on the pre-existing 3D models corresponding to the items; and
cause the generated 3D composite model to be rendered within a page of the software instance as a singular instance of product media.

13. The system of claim 12, wherein:
the 3D model template further includes background content; and
the at least one processor is to combine the pre-existing 3D models corresponding to the items with the background content in the 3D composite model.

14. The system of claim 12, wherein the at least one processor is to:
receive, from a user device, a second indication selecting a further item; and
responsive to receiving the second indication selecting the further item, update the 3D composite model to obtain an updated 3D composite model, the updated 3D composite model comprising the representations of the items and a representation of the further item.

15. The system of claim 12, wherein the items include a first item, and the at least one processor is to:
obtain first data regarding customer behavior pertaining to the items; and
select the first item for the product bundle based on the first data.

16. The system of claim 15, wherein the first data is specific to a particular customer, and the at least one processor is to:
transmit, to a user device associated with the particular customer, web content based on the 3D composite model for display on the user device.

17. The system of claim 15, wherein the items further include a second item, and the at least one processor is to:
select the first item for the product bundle responsive to obtaining the first data;
obtain second data regarding customer behavior pertaining to the items; and
responsive to obtaining the second data, select the second item for the product bundle based on the second data.

18. The system of claim 12, wherein the at least one processor is to:
receive, from a user device, a request for web content associated with the product bundle, the web content including a product page of an online store providing the 3D composite model; and
transmit the web content to the user device responsive to the request.

19. The system of claim 12, wherein placing each pre-existing 3D model at the respective location and orientation comprises assigning each pre-existing 3D model a respective coordinate and/or vector defined within a virtual coordinate system of the 3D composite model.

20. The system of claim 12, wherein the 3D model template further includes background content, and wherein each pre-existing 3D model is placed at the respective location and orientation according to the 3D model template so that the pre-existing 3D models are arranged and oriented relative to the background content.

21. A non-transitory computer readable medium storing computer executable instructions which, when executed by a computer, cause the computer to:
obtain an indication of items associated with a product bundle, wherein the indication includes a first indication selecting at least one of the items, the at least one of the items associated with a software instance;
obtain a three-dimensional (3D) model template based on both a number of the items associated with the product bundle and at least one of a product type, class, or category of the items associated with the product bundle, the 3D model template defining, for each item of the items associated with the product bundle, a respective location and a respective orientation for a 3D model corresponding to the item, wherein the 3D model template is further obtained by filtering template data based on the software instance;

obtain pre-existing 3D models corresponding to the items associated with the product bundle;

responsive to receiving the first indication indicating the selection of the at least one of the items;

generate a 3D composite model based on the 3D model template including placing each pre-existing 3D model at a respective location and orientation according to the 3D model template so that the pre-existing 3D models are arranged and oriented relative to one another in the 3D composite model, the 3D composite model comprising representations of the items associated with the product bundle based on the pre-existing 3D models corresponding to the items; and cause the generated 3D composite model to be rendered within a page of the software instance as a singular instance of product media.

22. The non-transitory computer readable medium of claim 21, wherein:

the 3D model template further includes background content; and generating the 3D composite model based on the 3D model template further comprises combining the pre-existing 3D models corresponding to the items with the background content in the 3D composite model.

23. The non-transitory computer readable medium of claim 22, wherein the background content comprises virtual lighting.

24. The non-transitory computer readable medium of claim 21, wherein the instructions, when executed by the computer, further cause the computer to:

receive, from a user device, a second indication selecting a further item; and responsive to receiving the second indication selecting the further item, update the 3D composite model to obtain an updated 3D composite model, the updated 3D composite model comprising the representations of the items and a representation of the further item.

25. The non-transitory computer readable medium of claim 21, wherein the items include a first item, and obtaining the indication of the items comprises:

obtaining first data regarding customer behavior pertaining to the items; and selecting the first item for the product bundle based on the first data.

* * * * *